(12) United States Patent
Ouderkirk et al.

(10) Patent No.: US 12,270,988 B2
(45) Date of Patent: Apr. 8, 2025

(54) DEFORMABLE LENS WITH AN EXTENDED RANGE OF STABILITY

(71) Applicant: META PLATFORMS TECHNOLOGIES, LLC, Menlo Park, CA (US)

(72) Inventors: Andrew John Ouderkirk, Kirkland, WA (US); Nagi Hosni Elabbasi, Needham, MA (US); Christopher Stipe, Woodinville, WA (US); Spencer Allan Wells, Seattle, WA (US); Kenneth Alexander Diest, Kirkland, WA (US); Christopher Yuan Ting Liao, Seattle, WA (US); Liliana Ruiz Diaz, Redmond, WA (US); Taha Masood, Sammamish, WA (US); Laura Cressman, Carnation, WA (US); James Howard Thomas Ransley, Medford, MA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 450 days.

(21) Appl. No.: 17/187,867

(22) Filed: Feb. 28, 2021

(65) Prior Publication Data

US 2022/0276483 A1 Sep. 1, 2022

(51) Int. Cl.
*G02B 26/00* (2006.01)
*G02B 3/12* (2006.01)
(Continued)

(52) U.S. Cl.
CPC .......... *G02B 26/0808* (2013.01); *G02B 3/12* (2013.01); *G02B 27/0172* (2013.01); *G02B 2027/0178* (2013.01)

(58) Field of Classification Search
CPC .. G02B 26/0808; G02B 3/12; G02B 27/0172; G02B 2027/0178; G02B 26/004;
(Continued)

(56) References Cited

U.S. PATENT DOCUMENTS 8,879,160 B2 * 11/2014 Bolis ................. G02B 26/0825
359/666
10,353,219 B1 * 7/2019 Hannaford ........... H04N 13/366
(Continued)

FOREIGN PATENT DOCUMENTS

| EP | 3540796 A1 | 9/2019 |
| WO | 9419834 A1 | 9/1994 |
| WO | 9631333 A1 | 10/1996 |

OTHER PUBLICATIONS

Feng et al., "Electroresponsive Ionic Liquid Crystal Elastomers", Macromolecular Rapid Communications, Liquid Crystals and Liquid Crystal Elastomers, vol. 40, No. 19, Article, 1900299, Jul. 2019, pp. 1-6.
(Continued)

*Primary Examiner* — Henry Duong
(74) *Attorney, Agent, or Firm* — Greenberg Traurig, LLP

(57) ABSTRACT

An electromechanical actuator includes a primary electrode, a secondary electrode overlying at least a portion of the primary electrode, and an electroactive layer disposed between the primary electrode and the secondary electrode, where the electroactive layer has a first curvature when zero voltage is applied between the primary electrode and the secondary electrode, and a second curvature when a non-zero voltage is applied between the primary electrode and the secondary electrode.

3 Claims, 19 Drawing Sheets

(51) Int. Cl.
*G02B 26/08* (2006.01)
*G02B 27/01* (2006.01)

(58) Field of Classification Search
CPC ...... G02B 3/14; G02B 26/005; G02B 26/007;
G02B 26/0825; G02B 26/0866; F03G
7/0121; F03G 7/025; H10N 30/204;
H10N 30/2048
USPC ...................................... 359/224.1
See application file for complete search history.

(56) References Cited

U.S. PATENT DOCUMENTS

| | | | | |
|---|---|---|---|---|
| 2013/0114148 | A1* | 5/2013 | Aschwanden | G02B 26/004 |
| | | | | 359/666 |
| 2017/0102489 | A1* | 4/2017 | Brown | G02B 5/22 |
| 2021/0336122 | A1* | 10/2021 | Johnson | F03G 7/0121 |
| 2022/0206193 | A1* | 6/2022 | Bellman | G02B 26/005 |

OTHER PUBLICATIONS

Le et al., "All-organic electrostrictive polymer composites with low driving electrical voltages for micro-fluidic pump applications", Science Reports, vol. 5, Article 11814, Jul. 3, 2015, pp. 1-13.

Schiava et al., "Effect of beta-based sterilization on P(VDF-TrFE-CFE) terpolymer for medical applications", Science Reports, vol. 10, Article 8805, 2020, 12 pages.

Wang et al., "Electrostrictive PVDF-TrFE Thin Film Actuators for the control of adaptive thin shell reflectors", Actuators, vol. 9, No. 53, Jul. 17, 2020, pp. 1-17.

Chang et al., "Ionic Electroactive polymers used in bionic robots: a review", Springer, Journal of Bionic Engineering, vol. 15, 2018, pp. 765-782.

Tiwari et al., "The state of understanding of ionic polymer metal composite architecture: a review", Smart Materials and Structures, vol. 20, Jul. 22, 2011, pp. 1-16.

Shen et al., "A comprehensive physics-based model encompassing variable surface resistance and underlying physics of ionic polymer-metal composite actuators", Journal of Applied Physics, vol. 118, Article 124904, 2015, pp. 1-12.

Joshi K.B., et al., "Modeling and Optimization of IPMC Actuator for Autonomous Jellyfish Vehicle (AJV)," Bioinspiration, Biomimetics, and Bioreplication, Spie Proceedings, vol. 7975, Mar. 7, 2011, 10 bages.

Office Action for International Application No. PCT/US2022/018047, mailed Jul. 1, 2022, 10 pages.

Wu Y., et al., "Pre-Curved PVDF/PI Unimorph Structures for Biomimic Soft crawling Actuators," IEEE Micro Electro Mechanical Systems(MEMS), Jan. 21, 2018, pp. 581-584.

International Search Report and Written Opinion for International Application No. PCT/US2022/018047, mailed Aug. 23, 2022, 16 pages.

* cited by examiner

DEFORMABLE LENS WITH AN EXTENDED RANGE OF STABILITY

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
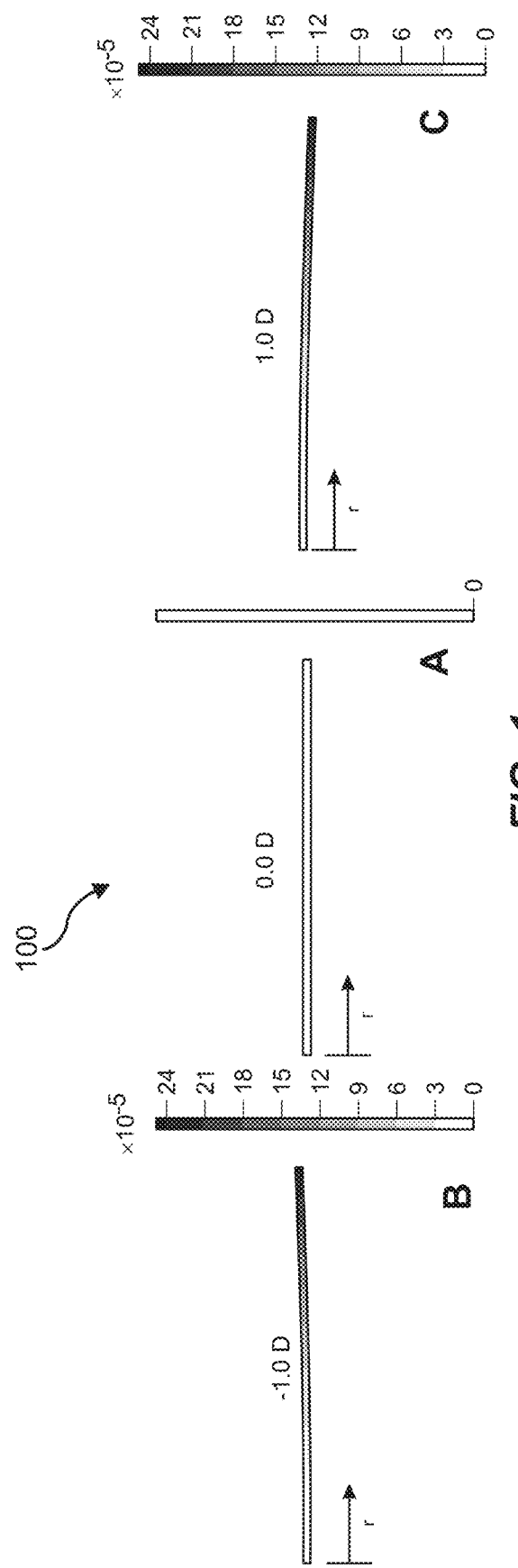
FIG. 1 shows the deformation response of a comparative unimorph actuator according to certain embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer, ceramic, and other dielectric materials may be incorporated into a variety of optic and electro-optic device architectures, including active and passive optics and electroactive devices. Electroactive materials, including electroactive polymers and ceramics, for instance, may change their shape under the influence of an electric field. Such materials have been investigated for use in various technologies, including actuation, sensing, and energy harvesting. Lightweight and conformable, electroactive polymers and ceramics may be incorporated into wearable devices such as haptic devices and are attractive candidates for emerging technologies including virtual reality/augmented reality devices where a comfortable, adjustable form factor is desired.

Virtual reality and augmented reality eyewear devices or headsets, for instance, may enable users to experience events, such as interactions with people in a computer-generated simulation of a three-dimensional world or viewing data superimposed on a real-world view. Virtual reality/augmented reality eyewear devices and headsets may also be used for purposes other than recreation. For example, governments may use such devices for military training, medical professionals may use such devices to simulate surgery, and engineers may use such devices as design visualization aids.

These and other applications may leverage one or more characteristic of thin film electroactive materials, including the refractive index to manipulate light and the Poisson's ratio to generate a lateral deformation (e.g., lateral expansion or contraction) as a response to compression between conductive electrodes. Example virtual reality/augmented reality assemblies containing electroactive layers may include deformable optics, such as mirrors, lenses, or adaptive optics. Deformation of one or more electroactive layers may be used to actuate optical elements in an optical assembly, such as a lens system. For instance, an electroactive material-based actuator may be used to tune the optical power of a liquid lens.

Although very thin layers of many electroactive polymers and ceramics can be highly transparent, the achievable force or displacement output may limit their use to an application space that can be outside of system functional requirements. Moreover, the onset of buckling and the creation of irreversible deformation or the inducement of cylindrical curvature may render an optical element unsatisfactory or unusable for particular applications. Thus, notwithstanding recent developments, it would be advantageous to provide electromechanical materials and related actuator architectures having improved actuation characteristics, including a controllable and commercially relevant deformation response in an optically transparent package.

In accordance with various embodiments, an electromechanical actuator may be incorporated into an optical element, such as within the transparent aperture of a liquid lens, although the present disclosure is not particularly limited and may be applied in a broader context. By way of example, the electromechanical actuator may be incorporated into an active grating, a tunable lens, accommodative optical elements, or adaptive optics, and the like. In some embodiments, an electromechanical actuator may be configured to induce a wider range of spherical deformation than is achievable using comparative actuator systems while avoiding the onset of buckling and the creation of unwanted cylindrical deformation. In addition to the foregoing, more advanced sphero-cylinder surfaces defined with higher order Zernike polynomials may be formed using the presently-disclosed electromechanical actuators.

According to various embodiments, the electromechanical actuator may be optically reflective or at least partially optically transparent. Furthermore, in accordance with various embodiments, a unipolar drive voltage may be used to control an electromechanical actuator and create a desired degree of optical power in an adjustable lens, thus decreasing the complexity of an associated voltage source.

With an adjustable lens, a lens profile may be tuned real-time or for a particular user to correct chromatic and monochromatic aberrations, including defocus, spherical aberrations, coma, astigmatism, field curvature, image distortions, and the like. The tuning of a lens may include the introduction of both spherical and cylindrical curvature. As used herein, the curve on the surface of a spherical lens, if extrapolated in all directions, would form a sphere. A cylinder curve, on the other hand, is curved along a single axis and planar along a perpendicular axis such that, whereas the focus of a spherical curve is a single point, the focus of a cylinder curve is a line. A lens that includes both spherical and cylinder curves may be referred to as a compound lens or toric.

As will be described in greater detail herein, the instant disclosure relates to electromechanical actuators and methods for forming and integrating such actuators. The electromechanical actuators may include one or more layers of an electroactive material where each layer is sandwiched between conductive electrodes. The disclosed electromechanical actuators may be configured to exhibit commercially-relevant electromechanical properties, including deformation response, long-term reliability, and integration compatibility, as well as beneficial optical properties, including antireflection and transparency.

An electromechanical actuator may be incorporated into a lens (or other optical element) and configured to create spherical curvature to the exclusion of cylindrical curvature. In various embodiments, the actuator may include one or more electroactive layers with corresponding electrodes that are arranged to apply an electric field independently across each of the electroactive layers. The electroactive layers may have a biaxial or uniaxial orientation and may be positioned such that the actuation and displacement of selected layers produces a desired net displacement including, for example, higher order Zernike perturbations.

In some embodiments, an electromechanical actuator may exhibit spherical curvature and have a corresponding radius of curvature of less than approximately 1500 mm, e.g., less than 1500, less than 1000, or less than 750 mm, including ranges between any of the foregoing values. In some embodiments, an electromechanical actuator may exhibit cylindrical curvature where a corresponding radius of curvature is at least approximately 1500 mm, e.g., 1500, 2000, or 2500 mm, including ranges between any of the foregoing values.

In some embodiments, an electromechanical actuator may be used to create axisymmetric deflections, including spherical or aspherical contributions to an overall deflection profile, as well as non-axisymmetric (e.g., asymmetric) deflections, including cylindrical, prismatic, tip/tilt, and/or freeform contributions, thus enabling the dynamic formation of a high-quality prescriptive lens or other optical element. An electromechanical actuator may be driven to impart low order coefficients of Zernike terms of a Zernike polynomial that defines a desired surface profile.

The electroactive layer(s) may include various electroactive materials, including organic materials such as electrostrictive or piezoelectric polymers or inorganic materials such as shape memory alloys or piezoceramics. According to certain embodiments, piezoelectric polymers and ceramics may be characterized by the piezoelectric coefficients $d_{31}$ and $d_{32}$, which correlate the displacement of charge per unit area (i.e., volume change) with an applied stress (i.e., an applied electric field).

As used herein, "electroactive" materials, including piezoelectric and electrostrictive materials may, in some examples, refer to materials that exhibit a change in size or shape when stimulated by an external electric field. In the presence of an electric field (E-field), an electroactive material may deform (e.g., compress, elongate, bend, etc.) according to the magnitude and direction of the applied field.

In accordance with various embodiments, when exposed to an external electric field, an accumulated displacement of ions within an electroactive ceramic, for example, may produce an overall strain (elongation) in the direction of the field. That is, positive ions may be displaced in the direction of the field and negative ions displaced in the opposite direction. In turn, the thickness of the electroactive ceramic may be decreased in one or more orthogonal directions, as characterized by the Poisson's ratio.

Generation of such a field may be accomplished, for example, by placing the electroactive material between two electrodes, i.e., a primary electrode and a secondary electrode, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive material may be in its relaxed state undergoing no induced deformation, or stated equivalently, no induced strain, either internal or external. In an example actuator, plural electromechanical layers may be individually electroded such that a multilayer structure includes alternating electrodes and electroactive layers.

In some instances, the physical origin of the compressive nature of many electroactive materials in the presence of an electrostatic field, being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive material, and on its elastic compliance. Compliance in this case is the change of strain with respect to stress or, equivalently, in more practical terms, the change in displacement with respect to force.

An electromechanical actuator may include a primary electrode, a secondary electrode overlying at least a portion of the primary electrode, and an electroactive layer disposed between the primary electrode and the secondary electrode, where the electroactive layer has (a) a first curvature when zero voltage is applied between the primary electrode and the secondary electrode and (b) a second curvature when a non-zero voltage is applied between the primary electrode and the secondary electrode.

In some embodiments, the deformation response may include a mechanical response to the electrical input that varies over the spatial extent of the actuator, with the electrical input being applied between the primary electrode(s) and the secondary electrode(s).

The electromechanical actuator may be deformable from an initial state to a deformed state when a first voltage is applied between the primary electrode(s) and the secondary electrode(s) and may further be deformable to a second deformed state when a second voltage is applied between the primary electrode(s) and the secondary electrode(s). In the absence of an applied voltage, the electromechanical actuator may exhibit a deformed initial state. According to various embodiments, the electromechanical actuator may be optically transparent.

As used herein, a material or element that is "transparent" or "optically transparent" may, for a given thickness, have a transmissivity within the visible light spectrum of at least approximately 70%, e.g., approximately 70, 80, 90, 95, 97, 98, 99, or 99.5%, including ranges between any of the foregoing values, and less than approximately 10% bulk haze, e.g., approximately 0.5, 1, 2, 4, 6, or 8% bulk haze, including ranges between any of the foregoing values. In accordance with some embodiments, a "fully transparent" material or element may have (a) a transmissivity (i.e., optical transmittance) within the visible light spectrum of at least approximately 90%, e.g., approximately 90, 95, 97, 98, 99, or 99.5%, including ranges between any of the foregoing values, (b) less than approximately 10% bulk haze, e.g., approximately 0.5, 1, 2, 4, 6, or 8% bulk haze, including ranges between any of the foregoing values, (c) less than approximately 30% reflectivity, e.g., approximately 1, 2, 5, 10, 15, 20, or 25% reflectivity, including ranges between any of the foregoing values, and (d) at least 70% optical clarity, e.g., approximately 70, 80, 90, 95, 97, 98, 99, or 99.5% optical clarity, including ranges between any of the foregoing values. Transparent and fully transparent materials will typically exhibit very low optical absorption and minimal optical scattering. In some embodiments, "transparency" may refer to internal transparency, i.e., exclusive of Fresnel reflections.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated by those skilled in the art, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

A material or element that is "reflective" or "optically reflective" may, for example, have a transmissivity within the visible light spectrum of less than approximately 2%, e.g., less than 2, 1, 0.5, 0.2, or 0.1%, including ranges between any of the foregoing values.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

According to various embodiments, the electroactive layer(s) may include a transparent polymer or ceramic and the electrodes may each include one or more layers, grids, nanowires, etc. of any suitable conductive material, such as transparent conductive oxides (e.g., TCOs such as ITO or IGZO), graphene, etc.

In some embodiments, an electroactive material may include a deformable polymer that may be symmetric with regard to electrical charge (e.g., polydimethylsiloxane (PDMS), acrylates, etc.) or asymmetric (e.g., poled polyvinylidene fluoride (PVDF) or its copolymers such as poly (vinylidene fluoride-co-trifluoroethylene) (PVDF-TrFE)). Further PVDF-based polymers may include poly(vinylidene fluoride-trifluoroethylene-chlorofluoroethylene (P(VDF-TrFE-CFE)) or poly(vinylidenefluoride-trifluoroethylene-chlorotrifluoroethylene (P(VDF-TrFE-CTFE)).

For piezoelectric polymers like PVDF homopolymer, the piezoelectric response may be tuned by altering the crystalline content and the crystalline orientation within the polymer matrix, e.g., by uniaxial or biaxial stretching, optionally followed by poling. The origin of piezoelectricity in PVDF homopolymer is believed to be the β-phase crystallite polymorph, which is the most electrically active and polar of the PVDF phases. Alignment of the β-phase structure may be used to achieve the desired piezoelectric effect. Poling may be performed to align the β-phase and enhance the piezoelectric response. Other piezoelectric polymers, such as PVDF-TrFE and PVDF-TrFE-CFE may be suitably oriented upon formation and the piezoelectric response of such polymers may be improved by poling with or without stretching.

Additional examples of materials forming electroactive polymers may include, without limitation, styrenes, polyesters, polycarbonates, epoxies, halogenated polymers, silicone polymers, and/or any other suitable polymer or polymer precursor materials including ethyl acetate, butyl acrylate, octyl acrylate, ethylethoxy ethyl acrylate, 2-chloroethyl vinyl ether, chloromethyl acrylate, methacrylic acid, dimethacrylate oligomers, isocyanates, allyl glycidyl ether, N-methylol acrylamide, or mixtures thereof. Such materials may have any suitable dielectric constant or relative permittivity, such as, for example, a dielectric constant ranging from approximately 2 to approximately 30. Example acrylates may be free-radical initiated.

According to some embodiments, an electroactive polymer layer may be formed by depositing a polymer precursor composition containing a curable material, e.g., onto a substrate, and curing the polymer precursor to form a polymer matrix. The polymer precursor composition may be, or include, a liquid. In addition to the curable material, the polymer precursor composition may include one or more of a polymerization initiator, surfactant, emulsifier, and/or other additive(s) such as cross-linking agents. In some embodiments, various components of the polymer precursor composition may be combined into a single mixture and deposited simultaneously. Alternatively, the various components may be deposited individually (i.e., in succession), or in any suitable combination(s).

An anisotropic polymer thin film may be formed using a thin film orientation system configured to heat and stretch a polymer thin film in at least one in-plane direction in one or more distinct regions thereof. In some embodiments, a thin film orientation system may be configured to stretch a polymer thin film along only one in-plane direction.

In some embodiments, an electroactive polymer may include an elastomer. As used herein, an "elastomer" may, in some examples, refer to a material having viscoelasticity (i.e., both viscosity and elasticity), relatively weak intermolecular forces, a generally low elastic modulus (a measure of the stiffness of a solid material), and a high strain-to-failure compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, or less than approximately 0.05). In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense).

In some embodiments, the term "effective density," as used herein, may refer to a parameter that may be obtained using a test method where a uniformly thick layer of an electroactive ceramic or polymer, e.g., elastomer, may be placed between two flat and rigid circular plates. In some embodiments, the diameter of the electroactive material being compressed may be at least 100 times the thickness of the electroactive material. The diameter of the electroactive layer may be measured, then the plates may be pressed together to exert a pressure of at least approximately $1 \times 10^6$ Pa on the electroactive layer, and the diameter of the layer is remeasured. The effective density may be determined from an expression ($DR=D_{uncompressed}/D_{compressed}$), where DR may represent the effective density ratio, $D_{uncompressed}$ may represent the density of the uncompressed electroactive layer, and $D_{compressed}$ may represent the density of the uncompressed electroactive layer.

According to further embodiments, an electroactive ceramic layer may include a transparent polycrystalline ceramic or a transparent single crystal material. In some embodiments, a polycrystalline electroactive ceramic may have a relative density of at least approximately 99%, e.g., 99%, 99.5%, 99.9%, 99.95%, 99.99%, 99.995%, or 99.999%, including ranges between any of the foregoing values, and an average grain size of at least approximately 300 nm, e.g., 300 nm, 400 nm, 500 nm, 1000 nm, or 2000 nm, including ranges between any of the foregoing values.

Example electroactive ceramics may include one or more ferroelectric ceramics, as well as solid solutions or mixtures thereof. Typically, ferroelectric materials are characterized by high dielectric permittivity values, where the temperature of the maximum real dielectric permittivity corresponds to the ferroelectric-paraelectric phase transition temperature. The so-called relaxor ferroelectrics, on the other hand, may exhibit a more elaborate dielectric response. Relaxor ferroelectrics may be characterized by (i) wide peaks in the temperature dependence of the dielectric permittivity, (ii) a frequency-dependent dielectric permittivity, where the temperature of the respective maxima for the real and imaginary components of the permittivity appear at different values, and (iii) a temperature of the maximum in the real dielectric permittivity that may be independent of the ferroelectric-paraelectric phase transition temperature.

The origin of relaxor behavior in ferroelectrics may be attributed to a positional disorder of cations on A or B sites of the perovskite blocks that delay the evolution of long-range polar ordering. Commonly, the localized disorder in relaxor compounds may be attributed to their complex and disordered chemical structure, where multiple atoms may substitute on one atomic site. In the example of lead magnesium niobium oxide, for instance, both magnesium and niobium can occupy the same position in the crystal lattice. As a further example, lead zirconate titanate (PZT) is a typical ferroelectric perovskite showing a conventional FE-PE phase transition. However, the partial substitution of different elements, such as lanthanum or samarium, may increase disorder within the material and induce relaxor characteristics. Moreover, in accordance with some embodiments, for some lanthanum or samarium concentrations, the distortion of the PZT crystalline lattice due to ion displacement may promote the formation of polar nanoregions (PNRs), which may inhibit the formation of long-range ferroelectric domains. For some compositions, polar nanoregions that are present under zero applied field may beneficially persist through an applied field of at least 2 V/micrometer, e.g., at least 0.5, 1, 1.5, or 2 V/micrometer, including ranges between any of the foregoing values, whereas other compositions having polar nanoregions under zero applied field (e.g., PLZT) may undergo a field-induced relaxor-to-ferroelectric phase transformation, which may adversely impact one or more optical properties.

In accordance with various embodiments, example electroactive ceramics may include one or more compositions from the relaxor-PT-based family, which includes binary compositions such as $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), ternary crystals such as $Pb(Zn_{1/3}Nb_{2/3})O_3$—$PbTiO_3$—$BaTiO_3$ (PZN-PT-BT), and the like. Generally, lead-based relaxor materials may be represented by the formula $Pb(B1B2)O_3$, where B1 may include $Mg^{2+}$, $Zn^{2+}$, $Ni^{2+}$, $Sc^{3+}$, $Fe^{3+}$, $Yb^{3+}$, $In^{3+}$, etc. and B2 may include $Nb^{5+}$, $Ta^{5+}$, $W^{6+}$, etc., although other relaxor compositions are contemplated.

Further electroactive ceramic compositions include barium titanate, barium titanium zirconium oxide, barium titanium tin oxide, barium strontium titanium oxide, barium zirconium oxide, lead magnesium titanium oxide, lead magnesium niobium oxide, lead magnesium niobium titanium zirconium oxide, lead scandium niobium oxide, lead scandium tantalum oxide, lead iron niobium oxide, lead iron tantalum oxide, lead iron tungsten oxide, lead indium niobium oxide, lead indium tantalum oxide, lead lanthanum zirconium titanium oxide, lead ytterbium niobium oxide, lead ytterbium tantalum oxide, lead zinc tantalum oxide, lead zinc niobium oxide, lead zinc niobium titanium oxide, lead zinc niobium titanium zirconium oxide, bismuth magnesium niobium oxide, bismuth magnesium tantalum oxide, bismuth zinc niobium oxide, bismuth zinc tantalum oxide, potassium sodium niobate, and combinations thereof.

Electroactive materials, including polycrystalline ceramics, may be formed by powder processing. Densely-packed networks of high purity, ultrafine polycrystalline particles can be highly transparent and may be more mechanically robust in thin layers than their single crystal counterparts. For instance, optical grade PLZT having >99.9% purity may be formed using sub-micron (e.g., <2 µm) particles. Substitution via doping of $Pb^{2+}$ at A- and B-site vacancies with $La^{2+}$ and/or $Ba^{2+}$ may be used to increase the transparency of perovskite ceramics such as textured or un-textured PLZT, PZN-PT and PMN-PT.

As known to those skilled in the art, ultrafine particle precursors can be fabricated via wet chemical methods, such as chemical co-precipitation, sol-gel and gel combustion. Grinding, ball milling, planetary milling, etc. may be used to modify the size and/or shape of ceramic powders. Green bodies may be formed using tape casting, slip casting, or gel casting. High pressure and high temperature sintering via techniques such as conventional sintering, cold sintering, hot pressing, high pressure (HP) and hot isostatic pressure, spark plasma sintering, flash sintering, two-stage sintering, and microwave sintering, for example, may be used to improve the ceramic particle packing density. More than one of the previous techniques may be used in conjunction as understood by one skilled in the art, for example, to achieve initial densification by one process and final densification by a secondary process while controlling grain growth during sintering. Sintered ceramics may be cut to a desired final shape and thinning via lapping and/or polishing may be used to decrease surface roughness to achieve thin, highly optically transparent layers that are suitable for high displacement actuation.

In addition to the foregoing, single crystal ceramics may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes (e.g., a primary electrode and a secondary electrode) may be formed directly on the wafer, using chemical vapor deposition or a physical vapor deposition process such as sputtering or evaporation, for example. According to some embodiments, an electroactive ceramic layer may have an RMS surface roughness of less than approximately 50 nm, e.g., less than 50, 40, 30, 20, 10, or 5 nm, including ranges between any of the foregoing values. The electroactive ceramic may be poled to achieve a desired dipole alignment.

In certain embodiments, the electroactive ceramics disclosed herein may be substantially free of secondary phases, i.e., may contain less than approximately 1% by volume of any secondary phase, including porosity, e.g., less than 1%, less than 0.5%, less than 0.2%, less than 0.1%, less than 0.05%, less than 0.02%, less than 0.01%, less than 0.005%, less than 0.002%, or less than 0.001% by volume, including ranges between any of the foregoing values. In some embodiments, the disclosed electroactive ceramics may be birefringent or substantially birefringent, which may be attributable to the material having plural distinct domains (e.g., polar nanoregions) or regions of varying polarization having different refractive indices.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

According to various embodiments, a relaxor ceramic may include discrete (localized) regions of polar, i.e., non-cubic, material in a matrix having cubic symmetry. According to some embodiments, the polar nanoregions may have at least one dimension (length, width, or depth) of less than approximately 100 nm, e.g., less than 100 nm, less than 50 nm, less than 40 nm, less than 30 nm, less than 20 nm, less than 10 nm, or less than 5 nm, including ranges between any of the foregoing values. Electroactive (relaxor) ceramics may, according to some embodiments, be characterized by cubic or pseudo-cubic symmetry.

In some embodiments, an electromechanical actuator may include paired electrodes, which allow the creation of the electrostatic field that forces displacement of an intervening electroactive layer. In some embodiments, an "electrode," as used herein, may refer to an electrically conductive material, which may be in the form of a grid, mesh, thin film or layer. Electrodes may include relatively thin, electrically conductive metals or metal alloys and may be of a non-compliant or compliant nature.

An electrode may include one or more electrically conductive materials, such as a metal, a semiconductor (e.g., a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), conducting polymers (e.g., PEDOT), or other electrically conductive materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium zinc tin oxide, indium gallium tin oxide, indium gallium zinc oxide, indium gallium zinc tin oxide, strontium vanadate, strontium niobate, strontium molybdate, and calcium molybdate.

Example electrodes may have a sheet resistance of less than approximately 5000 ohms/square. In some embodiments, the electrode or electrode layer may be self-healing, such that damage from local shorting of a circuit can be isolated. Suitable self-healing electrodes may include thin films of materials that deform or oxidize irreversibly upon Joule heating, such as, for example, aluminum.

In some embodiments, a primary electrode may overlap (e.g., overlap in a parallel direction) at least a portion of a secondary electrode. The primary and secondary electrodes may be generally parallel and spaced apart and separated by a layer of electroactive material. A tertiary electrode may overlap at least a portion of either the primary or secondary electrode.

An electromechanical actuator may include a first electroactive layer, which may be disposed between a first pair of electrodes (e.g., the primary electrode and the secondary electrode). A second electroactive layer may be located adjacent to the foregoing structure and may be disposed between a second pair of electrodes. In some embodiments, there may be an electrode that is common to both the first pair of electrodes and the second pair of electrodes.

In some embodiments, one or more electrodes may be optionally electrically interconnected, e.g., through a contact or schoopage layer, to a common electrode. In some embodiments, an optical element may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, transparent aluminum, an acrylate, or a silicone polymer.

In some applications, an electromechanical actuator used in connection with the principles disclosed herein may include a primary electrode, a secondary electrode, and an electroactive layer disposed between the primary electrode and the secondary electrode. In some embodiments, there may be one or more additional electrodes, and a common electrode may be electrically coupled to one or more of the additional electrodes. For example, plural electroactive layers may be disposed in a stacked configuration, with a first common electrode coupled to a first plurality of electrodes, and a second common electrode electrically connected to a second plurality of electrodes. In some embodiments, a common electrode may be electrically coupled (e.g., electrically contacted at an interface having a low contact resistance) to one or more other electrode(s), e.g., a secondary electrode and a tertiary electrode located on either side of a primary electrode.

An electromechanical actuator may include a layer of piezoelectric material, for example, having a uniaxial piezoelectric response (i.e., $d_{31} > d_{32}$) or a biaxial piezoelectric response (i.e., $d_{31} = d_{32}$). Alternatively, an electromechanical actuator may include plural, independently electroded layers of piezoelectric material. In the latter case, the piezoelectric response of the several layers may be aligned or rotationally offset relative to each other.

In some embodiments, electrodes may be flexible and/or resilient and may stretch, for example elastically, when an electromechanical actuator undergoes deformation. In this regard, electrodes may include a metal such as aluminum, graphene, carbon nanotubes, etc. In other embodiments, relatively rigid electrodes (e.g., electrodes including one or more transparent conducting oxides (TCOs) such as indium tin oxide (ITO) or indium gallium zinc oxide (IGZO)) may be used.

In some embodiments, the electrodes (e.g., the primary electrode and the secondary electrode) may have a thickness of approximately 0.35 nm to approximately 1000 nm, e.g., approximately 0.35, 0.5, 1, 2, 5, 10, 20, 50, 100, 200, 500, or 1000 nm, including ranges between any of the foregoing values, with an example thickness of approximately 10 nm to approximately 50 nm. In some embodiments, a common electrode may have a sloped shape, or may be a more complex shape (e.g., patterned or freeform). In some embodiments, a common electrode may be shaped to allow compression and expansion of an optical element or device during operation.

The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, approximately 99%, or approximately 99.5%, including ranges between any of the foregoing values.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, etc.

In some embodiments, a layer of electroactive material may be deposited directly over an electrode. In some embodiments, an electrode may be deposited directly over a layer of electroactive material. In some embodiments, electrodes may be prefabricated and attached to an electroactive material. For instance, a prefabricated electrode may be bonded to an electroactive layer by thermocompression or metallic bonding, or by using an adhesive layer such as a pressure sensitive or curable adhesive. Example pressure sensitive adhesives include various acrylate compounds. In further embodiments, an electrode may be deposited on a substrate, for example a glass substrate or flexible polymer film. In some embodiments, the electroactive material layer may directly abut an electrode. In some embodiments, there may be an insulating layer, such as a dielectric layer, between a portion of a layer of electroactive material and an electrode.

The electrodes may be used to affect large scale deformation, i.e., via full-area coverage, or the electrodes may be patterned to provide spatially localized stress/strain profiles. In particular embodiments, a deformable optical element and an electroactive layer may be co-integrated whereby the deformable optical element may itself be actuatable. In addition, various methods of forming optical elements are disclosed, including solution-based and solid-state deposition techniques.

For electroactive materials, particularly single crystal and polycrystalline piezoelectrics, optical absorption is characteristically low and transmissive losses are typically dominated by reflectivity. Moreover, piezoceramics and single crystal electroactive compositions typically have high refractive indices, which can substantially mismatch neighboring media resulting in surface reflections. Summarized in Table 1 are example materials that may be used for the electroactive layers, electrodes, passive supports, as well as application specific layers.

TABLE 1

Example Electromechanical Actuator Materials

|  | Material | Refractive Index |
|---|---|---|
| Electroactive Layers | PVDF | 1.42 |
|  | PMN-PT | 2.4-2.6 |
|  | PZT | 2.4 |
| Electrodes | ITO | ~1.9 |
| Passive Support | Plastic | 1.4-1.6 |
|  | Glass | 1.4-1.9 |
|  | Sapphire | 1.7-1.8 |
| Liquid Lens Fluid | Polyphenyl ether (PPE) | 1.58 |
|  | Phenylated siloxane oil | 1.62 |

In order to mediate reflective losses and inhibit the creation of optical artifacts such as ghost images, example electromechanical actuator structures may further include a reflective or antireflective coating (ARC). According to various embodiments, a reflective or antireflective coating may be disposed over either or both electrodes (e.g., a primary antireflective coating may be formed over at least a portion of a surface of the primary electrode opposite to the electroactive layer and/or a secondary reflective or antireflective coating may be formed over at least a portion of a surface of the secondary electrode opposite to the electroactive layer).

The antireflective coating(s) may be optically transparent and accordingly exhibit less than 10% bulk haze and a transmissivity within the visible spectrum of at least 70%. For instance, an antireflective coating may be configured to maintain at least 70% transmissivity over $10^6$ actuation cycles and an induced engineering strain of up to approximately 1%. In some embodiments, the antireflective coating(s) may exhibit a reflectivity within the visible spectrum of less than approximately 30%.

Example antireflective coatings may include one or more dielectric layers, which may include a stoichiometric or non-stoichiometric oxide, fluoride, oxyfluoride, nitride, oxynitride, sulfide, including but not limited to $SiO_2$, $TiO_2$, $Al_2O_3$, $Y_2O_3$, $HfO_2$, $ZrO_2$, $Ta_2O_5$, $Cr_2O_3$, $AlF_3$, $MgF_2$, $NdF_3$, $LaF_3$, $YF_3$, $CeF_3$, $YbF_3$, $Si_3N_4$, ZnS, or ZnSe.

In some embodiments, an antireflective coating may be configured as a multilayer stack. A multilayer stack may include one or more dielectric layers, and in certain embodiments an antireflective coating may include a transparent electrode. That is, a primary electrode or a secondary electrode may be integrated into a multilayer antireflective coating.

In some embodiments, the anti-reflective coating may include combinations of one or more of the aforementioned oxides and/or one or more of the aforementioned fluorides. Example anti-reflective coatings may include: (a) one of the above-identified oxides, (b) one of the above-identified fluorides, (c) two of the above-identified oxides, (d) one of the above-identified oxides combined with one of the above-identified fluorides, (e) two of the above-identified oxides combined with one of the above-identified fluorides, (f) two of the above-identified oxides combined with two of the above-identified fluorides, or (g) three of the above-identified oxides. By way of example, a multilayer stack may include a layer of zinc oxide disposed directly over an electrode and a layer of silicon dioxide disposed over the layer of zinc oxide, although further combinations are contemplated.

In accordance with some embodiments, an antireflective coating may operate to gradually decrease the refractive index between that of the electroactive layer and an adjacent, typically lower index material. In various embodiments, an antireflective coating may include multiple layers of varying refractive index and/or one or more layers having a refractive index gradient.

An ARC layer may have any suitable thickness, including, for example, a thickness of approximately 10 nm to approximately 1000 nm, e.g., approximately 10, 20, 50, 100, 200, 500, or 1000 nm, including ranges between any of the foregoing values, with an example thickness range of approximately 50 nm to approximately 100 nm.

In various embodiments, the one or more layers within an antireflective coating may be fabricated using any suitable process. For example, the ARC layer(s) may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like.

In some embodiments, an electromechanical actuator may include a barrier layer. A suitable barrier layer may operate as a functional coating adapted to decrease the transmittance therethrough of light and/or the transpiration therethrough of water, water vapor, or other liquids or gases. In certain embodiments, a barrier layer may be configured to inhibit the permeation of water vapor to less than approximately $10^{-6}$ g/m²/day and/or inhibit the permeation of oxygen to less than approximately $10^{-5}$ cm³/m²/day. According to further embodiments, a barrier layer may improve the mechanical robustness of an electromechanical actuator, e.g., via crack blunting and/or vibration reduction. A barrier layer may be colorless, chemically inert, electrically insulating, and/or scratch resistant and may include various epoxy compounds. In some embodiments, an antireflective coating, e.g., one or more layers within a multilayer antireflective coating, may serve as a barrier layer.

A bonding layer, such as an optical adhesive, may be used to join adjacent layers within an electromechanical actuator. According to some embodiments, a bonding layer may include a pressure-sensitive adhesive (PSA) such as one or more acrylate-based polymers derived from soft monomers (i.e., low $T_g$ monomers for tack and flexibility), hard monomers (i.e., high $T_g$ monomers for cohesion strength) and functional monomers (e.g., for adhesion strength). Example PSA materials include 2-ethylhexyl acrylate (2-EHA), methyl methacrylate (MMA), butylacrylate, hexylacrylate, isooctylacrylate, 2-hydroxyethyl acrylate (2-HEA), lauryl acrylate (LA), acrylic acid (AA), 2-phenoxy ethyl acrylate (2-PEA), etc. In some embodiments, such acrylates may be functionalized with a cross linking agent, such as aluminum acetylacetonate (AlAcAc), zirconium acetylacetonate (ZrAcAc), hafnium carboxyethyl acrylate (HCA), and the like. Further example bonding layers may include epoxies and silicones.

In some embodiments, the barrier layer and/or the bonding layer may include a double network tough adhesive (DNTA). A DNTA, which may be colorless and optically clear, may include a high-performance PSA with acid and epoxy functionalities combined with an acrylated urethane oligomer, a methacrylated silane thermoset cross-linker, and/or a photo-initiator (e.g., a metal chelate ionic cross-linker). A barrier layer and/or bonding layer, if provided, may be indexed-matched with the electroactive layer(s) to decrease internal reflection amongst the plural layers of an electromechanical actuator.

In accordance with certain embodiments, an electromechanical actuator may include a passive support, which may include a glass, ceramic, polymer or other dielectric composition. An example passive support may include sapphire. A passive support may influence the mechanical performance of the actuator including its stiffness and buckling response. In some embodiments, the support may include a planar, meniscus, or ophthalmic glass substrate. In some embodiments, a bonding layer may be used to affix the passive support to the actuator architecture. In some embodiments, a passive support may be optically transparent.

In accordance with certain embodiments, a transparent electromechanical actuator including an electroactive layer disposed between transparent electrodes may be incorporated into a variety of device architectures where capacitive actuation and the attendant strain realized in the electroactive layer (e.g., lateral expansion and compression in the direction of the applied electric field) may induce deformation in one or more adjacent active layers within the device and accordingly change the optical performance of the active layer(s). Lateral deformation may be essentially 1-dimensional, in the case of an anchored thin film, or 2-dimensional.

Insomuch as many piezoelectric ceramics and single crystals are limited to less than approximately 0.1% to approximately 2% strain before failure, electromechanical actuators are commonly operated in a bending mode to achieve large displacements albeit with a compromise in force output. In an example bimorph bending mode actuator, alternating tensile and compressive stresses above and below a neutral plane may be used to generate bending motion. As such, electromechanical actuators with one or more electroactive layers may be used to achieve a desired stress (and strain) condition.

In certain applications, such as a liquid lens, where a high net displacement over a large surface area may be beneficial, the onset of buckling instabilities may decrease the accessible actuation range for some actuator geometries. As used herein, in connection with various embodiments, the term "buckling" may refer to an undesirable, non-spherical deformation of an actuator or lens. Buckling may be associated with a geometric non-linearity, and may be quantified by the formation of cylindrical distortions, for example. Buckling may occur when a structure is loaded above a critical compressive stress, which for an electromechanical actuator may be related to the stress induced via the indirect piezoelectric effect. According to some embodiments, however, the usable actuation range otherwise limited by a buckling instability may be improved through appropriate mechanical design, e.g., to increase the critical compressive stress of the electroactive layer(s).

In some embodiments, an optical device may include a liquid lens. As will be appreciated, in accordance with various embodiments, a liquid lens fitted with an electromechanical actuator may provide varifocal accommodation with high see-through quality and effective actuation within a commercially-relevant form factor. That is, a liquid lens having a transparent electromechanical actuator functioning as a deformable surface is an attractive solution to meet space constraints.

According to various embodiments, an electromechanical actuator may include alternating electrode and electroactive material layers. The application of a voltage between respective electrode pairs can cause compression or expansion of the intervening electroactive layer in the direction of the applied electric field and an associated expansion or contraction of the electroactive layer in one or more transverse dimensions. In some embodiments, an applied voltage (e.g., to a primary electrode and/or a secondary electrode) may create at least approximately 0.02% strain in an electroactive layer (e.g., an amount of deformation in the direction of the applied force resulting from the applied voltage divided by the initial dimension of the material) in at least one direction (e.g., an x, y, or z direction with respect to a defined coordinate system).

An electrical signal may include a potential difference, which may include a direct or alternating voltage. In some embodiments, the frequency may be higher than the highest mechanical response frequency of the device, so that deformation may occur in response to the applied RMS electric field but with no appreciable oscillatory mechanical response to the applied frequency. The applied electrical signal may generate uniform or non-uniform constriction of the electroactive layers between the respective primary and secondary electrodes. A non-uniform electroactive response may include a curvature of a surface of the optical element, which may in some embodiments be a compound curvature.

In some embodiments, an optical device may include additional elements interleaved between electrodes, such as in a stacked configuration. For example, electrodes may form an interdigitated stack of electrodes, with alternate electrodes connected to a first common electrode and the remaining alternate electrodes connected to a second common electrode. An additional optical element may be disposed on the other side of a primary electrode. The additional optical element may overlap a first optical element. An additional electrode may be disposed abutting a surface of any additional optical element.

A liquid lens integrated with an electromechanical actuator may be reversibly changed from one compound curvature to another through the application of a suitable voltage to the actuator. A focal length range may be extended using such an electromechanical actuator, which may be controllably switched from a negative curvature (e.g., a −1 or a −1.5 diopter shape), through a planar or substantially planar geometry, to a positive curvature (e.g., a +1 or a +1.5 diopter shape) or vice versa.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-20, a detailed description of electromechanical actuators having an extended range of stability. The discussion associated with FIGS. 1-18 relates to the architecture and operation of various example electromechanical actuators. The discussion associated with FIGS. 19 and 20 relates to exemplary virtual reality and augmented reality devices that may include an electromechanical actuator as disclosed herein.

The strain response of a comparative actuator is shown in FIG. 1. Unimorph actuator 100 is shaped as a round disk having a radius (r) of 2.5 cm and includes a 200 micrometer thick electroded piezoelectric layer overlying and bonded to a 200 micrometer thick passive layer (not separately shown). The piezoelectric layer and the passive layer each have a Young's modulus of approximately 1 GPa and a Poisson's ratio of approximately 0.35. As shown in the cross-sectional view of FIG. 1A, with no applied voltage, actuator 100 is flat and exhibits no strain.

Referring to FIG. 1B, under an applied voltage of one polarity, the actuator deforms and has a radius of curvature of approximately 670 mm, which is equivalent to approximately −1.0 diopter (−1.0 D) for light passing at a normal angle through a major surface of the actuator and through a lens fluid having a refractive index of approximately 1.67. The disk has very low strain at the center of the disk, and high strain toward the edge. Referring to FIG. 1C, reversing the polarity of the applied voltage causes the actuator to bend in the opposite direction and exhibit a curvature corresponding to approximately +1.0 diopter (1.0 D).

Figure 2:
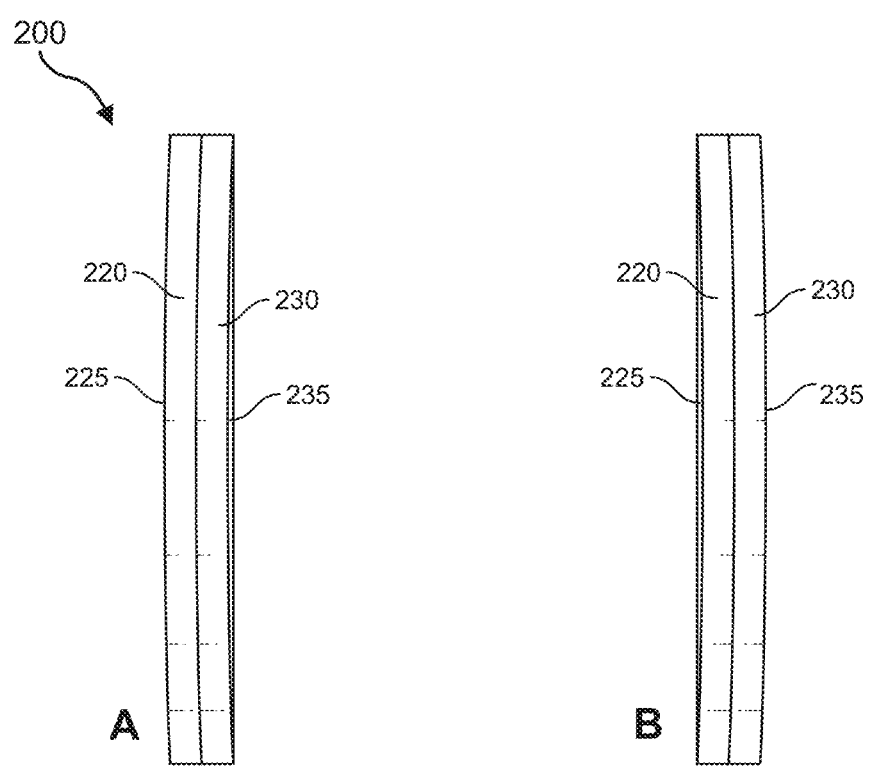
FIG. 2 illustrates the actuation kinetics of an example electromechanical actuator according to some embodiments.

The configuration of an electromechanical actuator having an increased range of stable deformation is shown in FIG. 2. Electromechanical actuator 200 may include an electroactive layer 220 and an adjacent passive layer 230. The electroactive layer 220 may be disposed between a primary electrode and a secondary electrode (not shown). By way of example, electroactive layer 220 may include a biaxially oriented piezoelectric thin film and passive layer 230 may include a deformable polymer such as polymethylmethacrylate (PMMA).

In accordance with various embodiments, and with reference to FIG. 2A, electromechanical actuator 200 may exhibit a first state of curvature when no electric field is applied across the electroactive layer 220 such that a surface 225 of electroactive layer 220 is convex and a surface 235 of passive layer 230 is concave. In response to an applied voltage, and with reference to FIG. 2B, the electromechanical actuator 200 may deform and result in a change in curvature where the surface 225 of electroactive layer 220 is concave and the surface 235 of passive layer 230 is convex.

Figure 3:
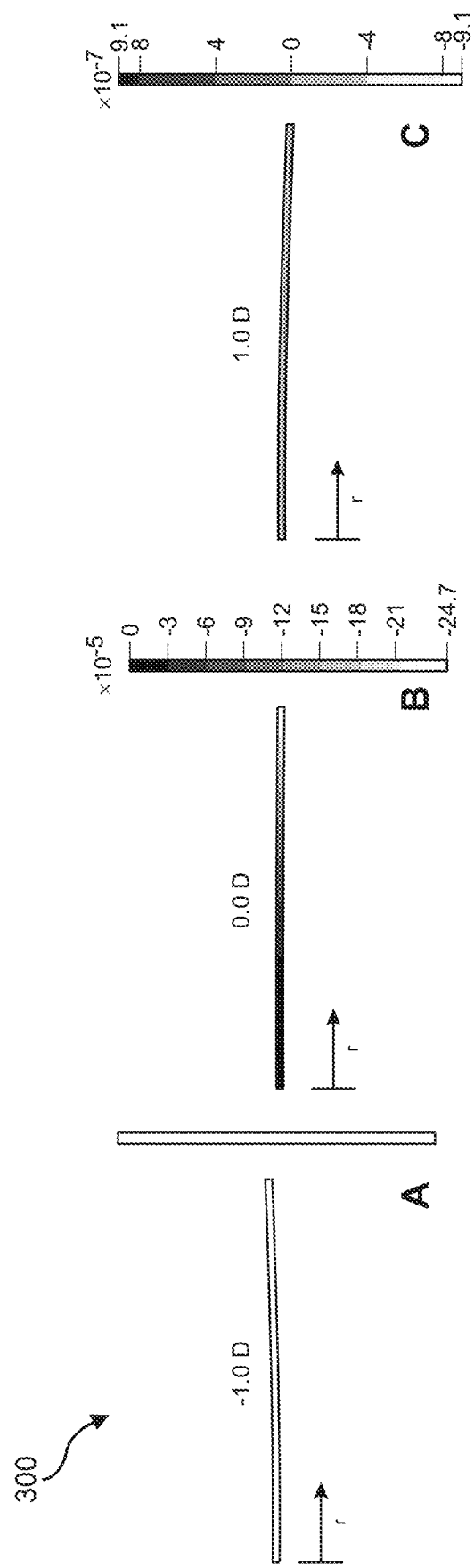
FIG. 3 shows the deformation response of an electromechanical actuator according to certain embodiments.

The strain response of an example electromechanical actuator is shown in FIG. 3. Referring to FIG. 3A, in an unactuated (un-biased state), electromechanical actuator 300 exhibits a curvature corresponding to approximately −1.0 diopter but exhibits no strain. Referring to FIG. 3B, with an initial increase in applied field, electromechanical actuator 300 exhibits a high strain state particularly near the center, corresponding to 0.0 diopter and, as depicted in FIG. 3C, with a further increase in applied field, electromechanical actuator 300 deforms to a geometry corresponding to +1.0 diopter and exhibits a lesser degree of strain than in the intermediate state. Deformation of electromechanical actuator may accompany the creation of spherical and/or cylindrical curvature.

The degree of cylinder within the curvature of a liquid lens, e.g., within a central region of the lens, may be calculated as the product of an average optical power with a maximum difference between an in-plane radial strain and a circumferential (hoop) strain that would collectively induce perfect spherical deformation. Without wishing to be bound by theory, the propensity for buckling may be directly proportional to the maximum difference. As used herein, the extent of cylinder may also be referred to as "average cylindricity" or "optical error indicator."

In contrast to comparative actuators where an unbiased state corresponds to a planar or substantially planar lens geometry, the electromechanical actuators disclosed herein may have a deformed unbiased state and may accordingly access a wider range of accessible lens curvature without the onset of buckling or the generation of unwanted cylindrical distortions. This wider range of low optical error distortions is illustrated graphically in FIGS. 4-6, which represent theoretical calculations of idealized strains needed to deform a round lens into any desired target curvature. For the data in FIGS. 4-6, a round lens having a radius of 2.5 cm, a thickness of 0.4 mm, and a Young's modulus of 1 MPa were assumed.

Figure 4:
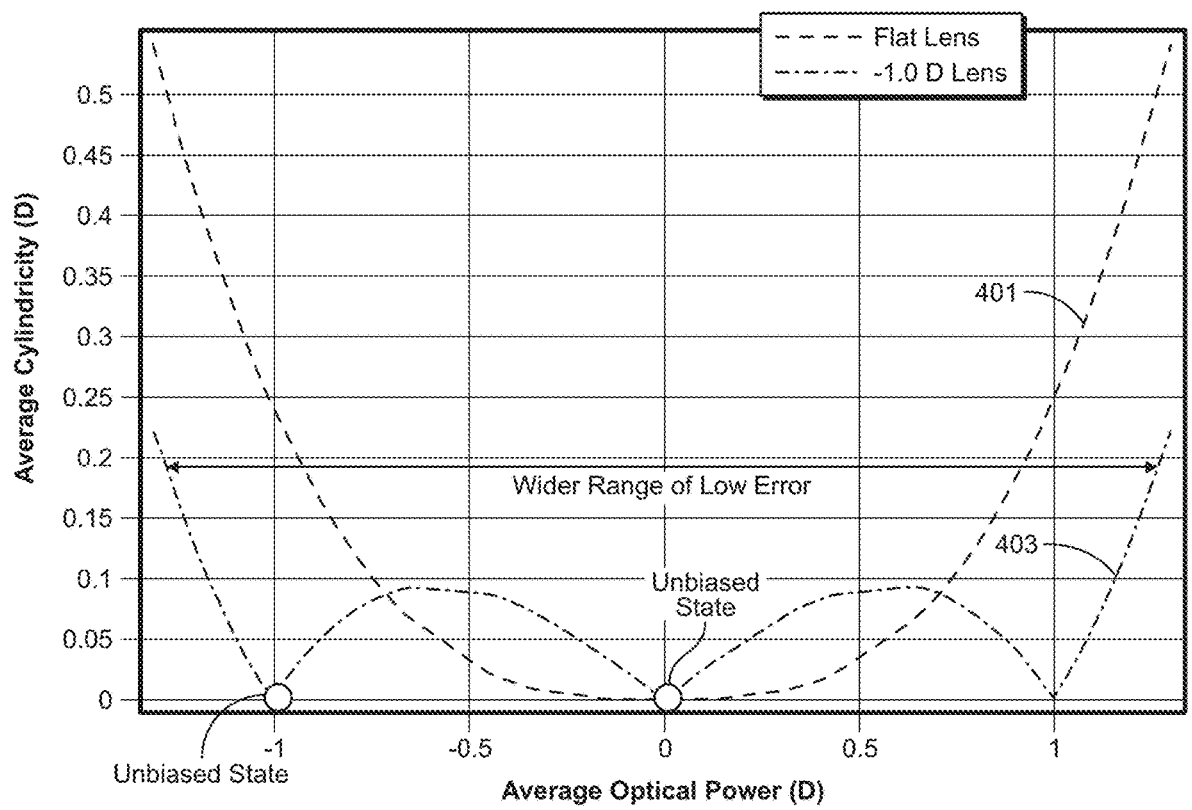
FIG. 4 is a plot of cylindricity versus optical power for both a comparative actuator and an electromechanical actuator according to various embodiments.

FIG. 4 is a plot of average cylindricity (optical error indicator) versus average optical power for both a comparative actuator and an electromechanical actuator according to various embodiments. Although different applications may have different tolerances to cylindrical distortion, Applicants have shown that for many optical applications, an average cylindricity for a lens or other optical element may be desirably less than approximately 0.5 diopters, e.g., less than 0.5, 0.45, 0.4, 0.35, 0.3, 0.25, 0.2, or 0.15 diopters.

With reference initially to curve 401, when biased in either direction from an initially flat unbiased state, a comparative lens may form non-spherical distortions, corresponding to increasing average cylindricity values and a diopter range for an average cylindricity at 0.2 diopters of approximately 1.9 diopters.

Turning to curve 403, an exemplary electromechanical actuator may have an unbiased concave/convex state at −1 diopter and may be biased through an intermediate flat state to a convex/concave state at +1 diopter. As will be appreciated, the electromechanical actuator exhibits a wider range of lower distortion than the comparative actuator, which may be attributable at least in part to the symmetry in hoop stress between the concave and the convex profiles.

For an average cylindricity of 0.2 diopters, the electromechanical actuator (curve 403) has a working range of approximately 3 diopters, which corresponds to an increase in the working range relative to the comparative actuator of nearly 60%.

Moreover, although both structures have an operating range of at least approximately 2 diopters, the electromechanical actuator exhibits lesser cylinder distortion extremes, although the magnitude of displacement of the electromechanical actuator is double (i.e., −1 diopter to +1 diopter versus 0±1 diopter).

Figure 5:
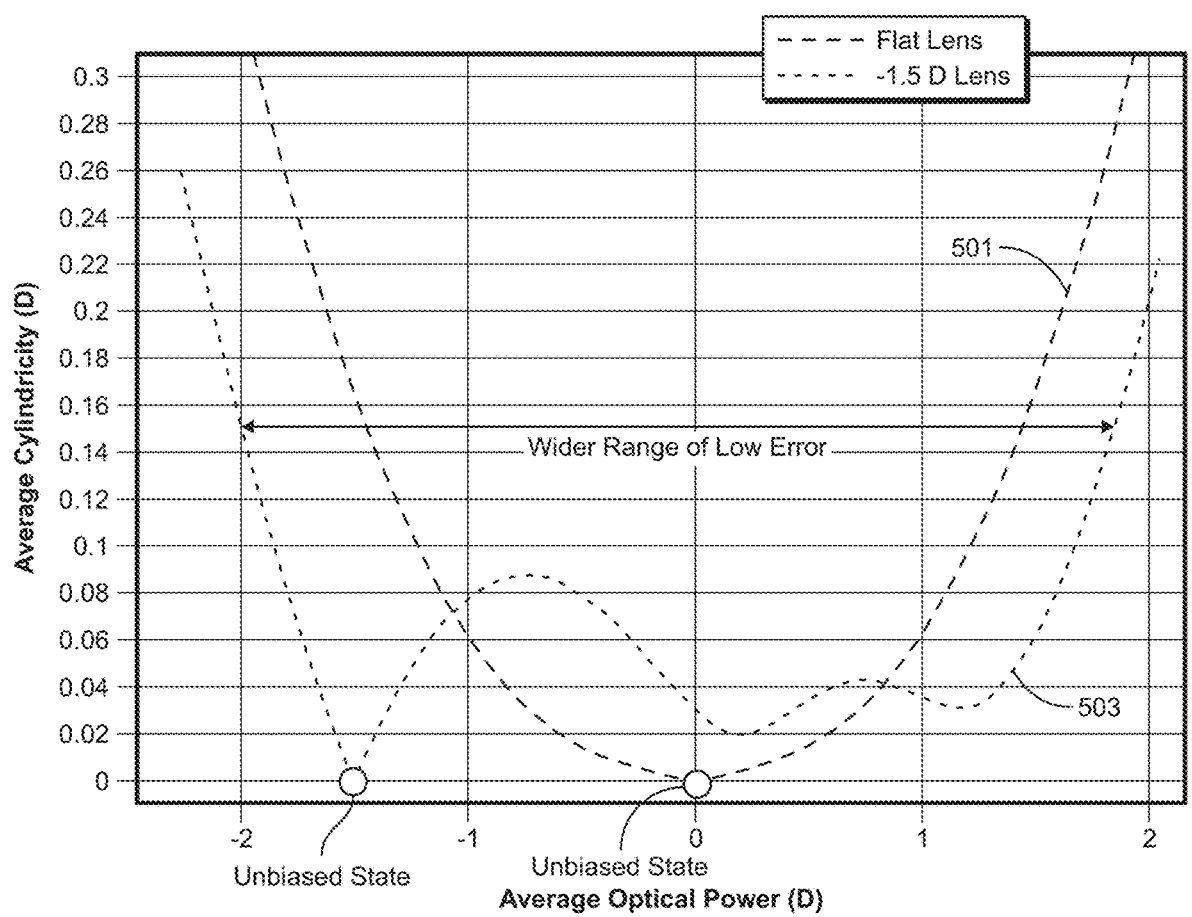
FIG. 5 is a plot of cylindricity versus optical power for a comparative actuator and an electromechanical actuator according to further embodiments.

A further plot of average cylindricity versus average optical power is shown in FIG. 5, where curve 501 corresponds to a comparative actuator and curve 503 corresponds to an electromechanical actuator having an initial unbiased concave/convex state at an average optical power of approximately −1.5 diopters. As in the previous embodiment, the electromechanical actuator exhibits a wider range of low cylindrical distortions and, thus, an effectively greater working range.

Figure 6:
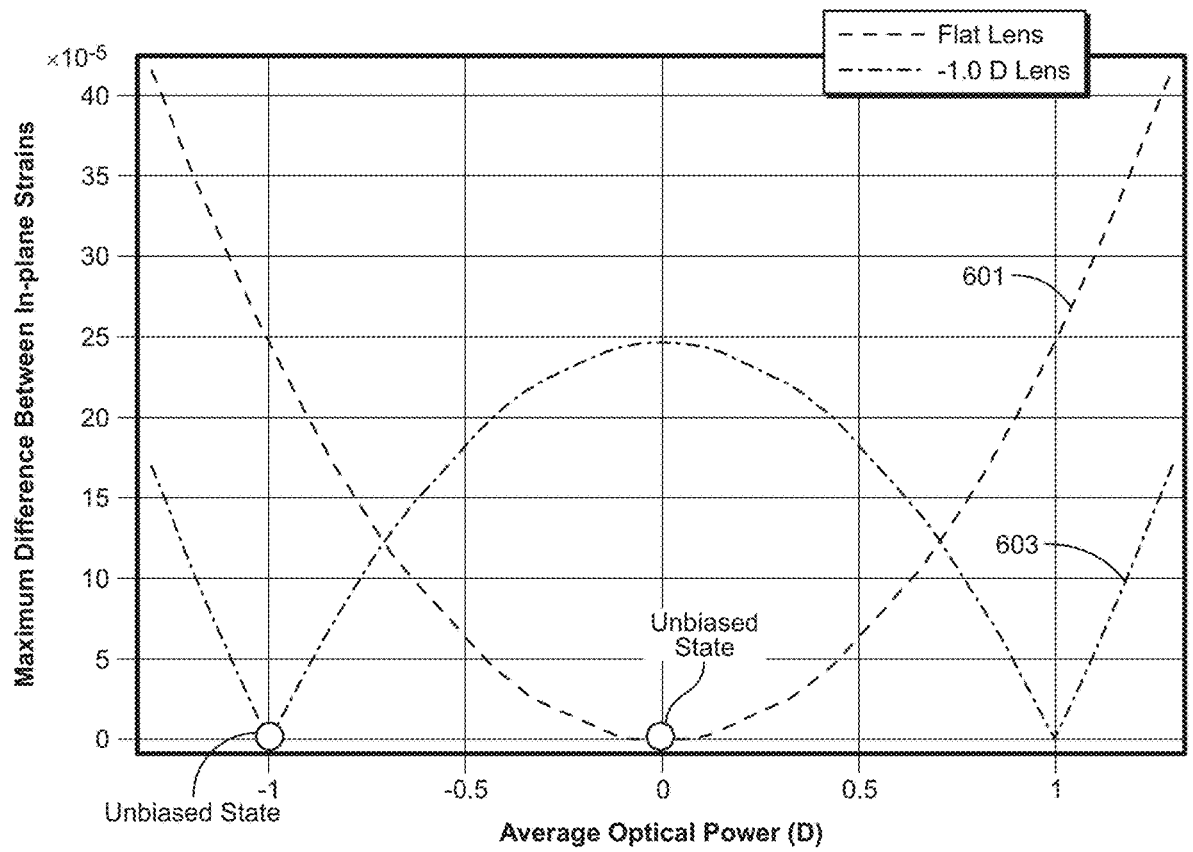
FIG. 6 is a plot of differential in-plane strain versus optical power for a comparative actuator and an electromechanical actuator according to some embodiments.

FIG. 6 is a plot of the maximum difference between the two in-plane strain components, comparing a lens that is initially flat (curve 601) to a lens with an initial average optical power of −1 diopter (curve 603), or an equivalent radius of curvature of 670 mm. The strain components are the theoretical strains required to create a stress-free transformation of the lens from its original geometry to a desired diopter value. Since electrical actuation of the lens usually creates a uniform strain field throughout the lens, the difference in the ideal strains required for actuation shown in FIG. 6 may be used as a metric for determining or avoiding lens distortion including buckling.

In some embodiments, an electromechanical actuator may include one or more passive layers, which may, for example, provide mechanical support to the actuator or an associated optical element. A passive layer may be integrated into a structure of alternating electrodes and active electroactive layers. Additionally or alternatively, a passive layer may be disposed over one or both major surfaces of an electromechanical actuator. Such a structure may be incorporated into an optical element, e.g., a liquid lens.

Figure 7:
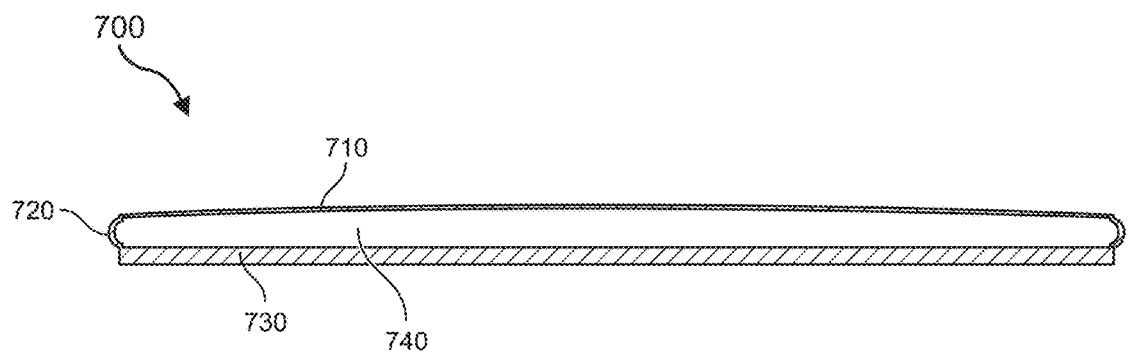
FIG. 7 is a cross-sectional view showing the integration of an electromechanical actuator into a liquid lens according to some embodiments.

An example liquid lens is shown in FIG. 7. Liquid lens 700 may be configured for one or more artificial reality applications, and may include an electromechanical actuator 710 (e.g., actuator 200), an edge seal 720 located between the actuator 710 and a passive support 730, and a lens fluid 740 disposed between the actuator 710 and the support 730 and contained by the edge seal 720. An example edge seal 720 may include polyurethane or silicone rubber. Suitable lens fluids 740 may include silicones and oils, including various polyphenyl thioethers. In the illustrated lens 700, electromechanical actuator 710 may directly overly lens fluid 740 and, in an unactuated state, may have an outwardly-facing convex profile (as illustrated) or an outwardly-facing concave profile.

According to some embodiments, a liquid lens may include a substrate, an electroactive layer overlying the substrate, a liquid layer disposed between the substrate and the electroactive layer, and a seal located between the substrate and the electroactive layer peripheral to the liquid layer, where the electroactive layer has a first curvature (r1) when zero voltage is applied across the electroactive layer, a second curvature (r2) when a non-zero voltage is applied across the electroactive layer, and r1 is substantially equal to −r2.

Figure 8:
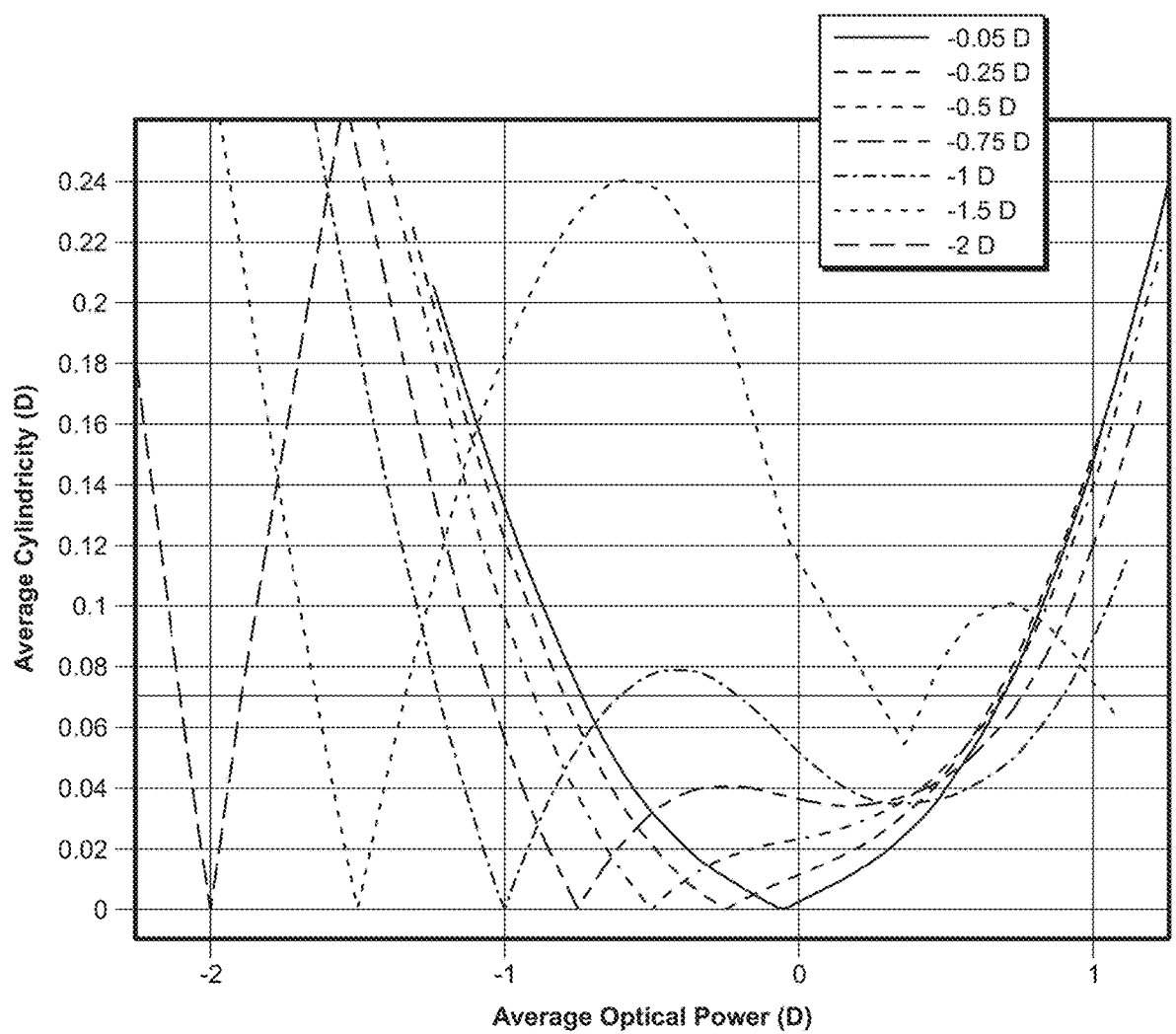
FIG. 8 is a plot of cylindricity versus optical power for example integrated electromechanical actuators showing the effect of initial lens curvature according to some embodiments.

Referring to FIG. 8, shown is a plot of average cylindricity in diopters as a function of lens actuation for lenses having different initial curvature. The modeled lenses include a 0.2 mm thick layer of electroactive polymer overlying a 0.18 mm thick passive polymer layer. The electroactive polymer layer is characterized by a $Q_{12}$ response of approximately 1.394 m$^4$/C$^2$, a dielectric constant of approximately 800, and a Young's modulus of approximately 40 MPa. For electroactive materials, the $Q_{12}$ term relates in-plane strains to the polarization of the material. The passive polymer layer is characterized by a Young's modulus of approximately 8 GPa.

Figure 9:
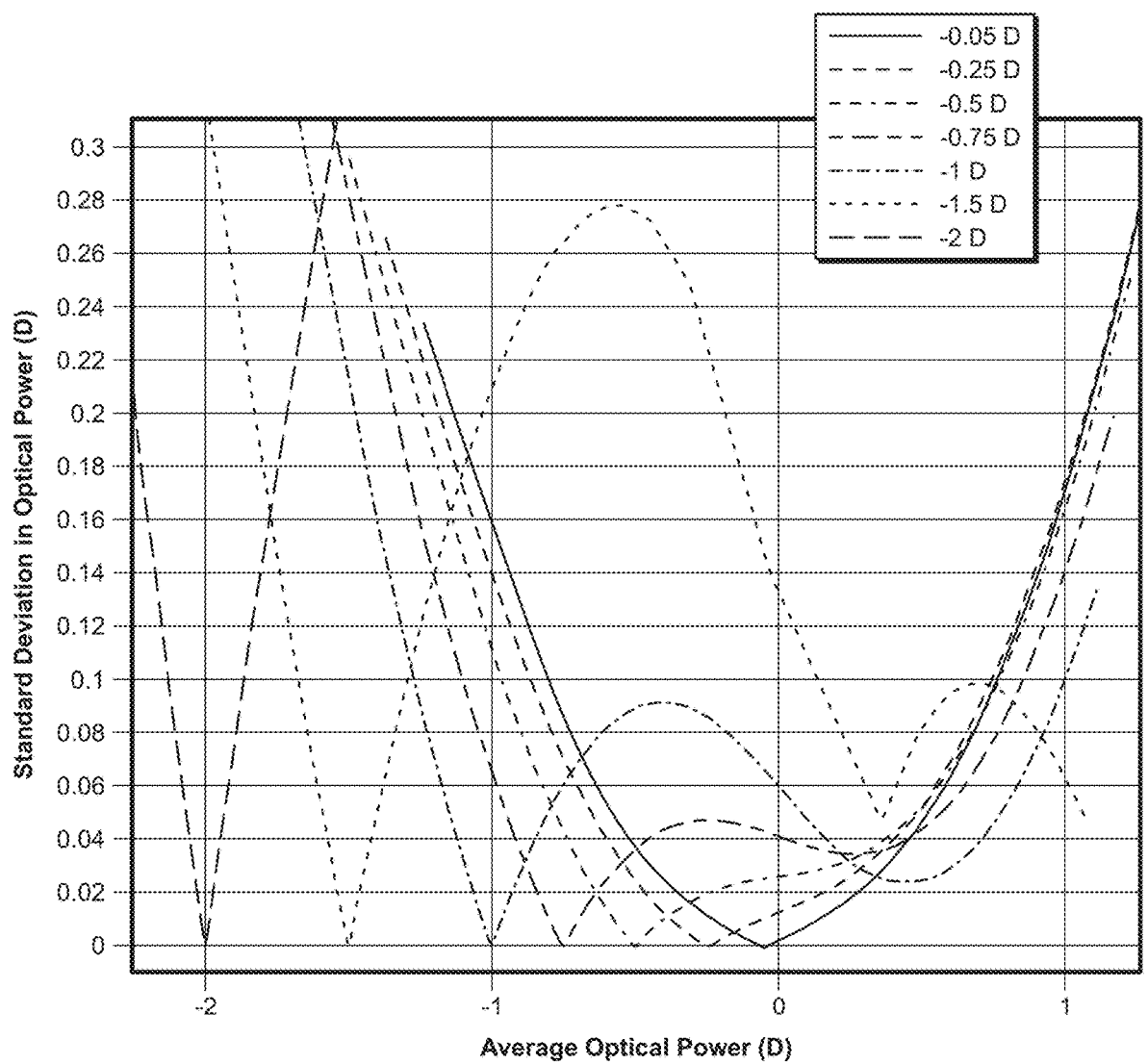
FIG. 9 is a plot of the standard deviation in optical power versus optical power for integrated electromechanical actuators showing the effect of initial lens curvature according to some embodiments.

Depending on a given system's tolerance for cylindrical distortions, FIG. 8 shows that useful initial curvatures may correspond to an equivalent optical power of −1, −1.5, or even −2 diopters. FIG. 9 is a plot of the standard deviation in optical power in diopters versus optical power for the lenses of FIG. 8.

Figure 10:
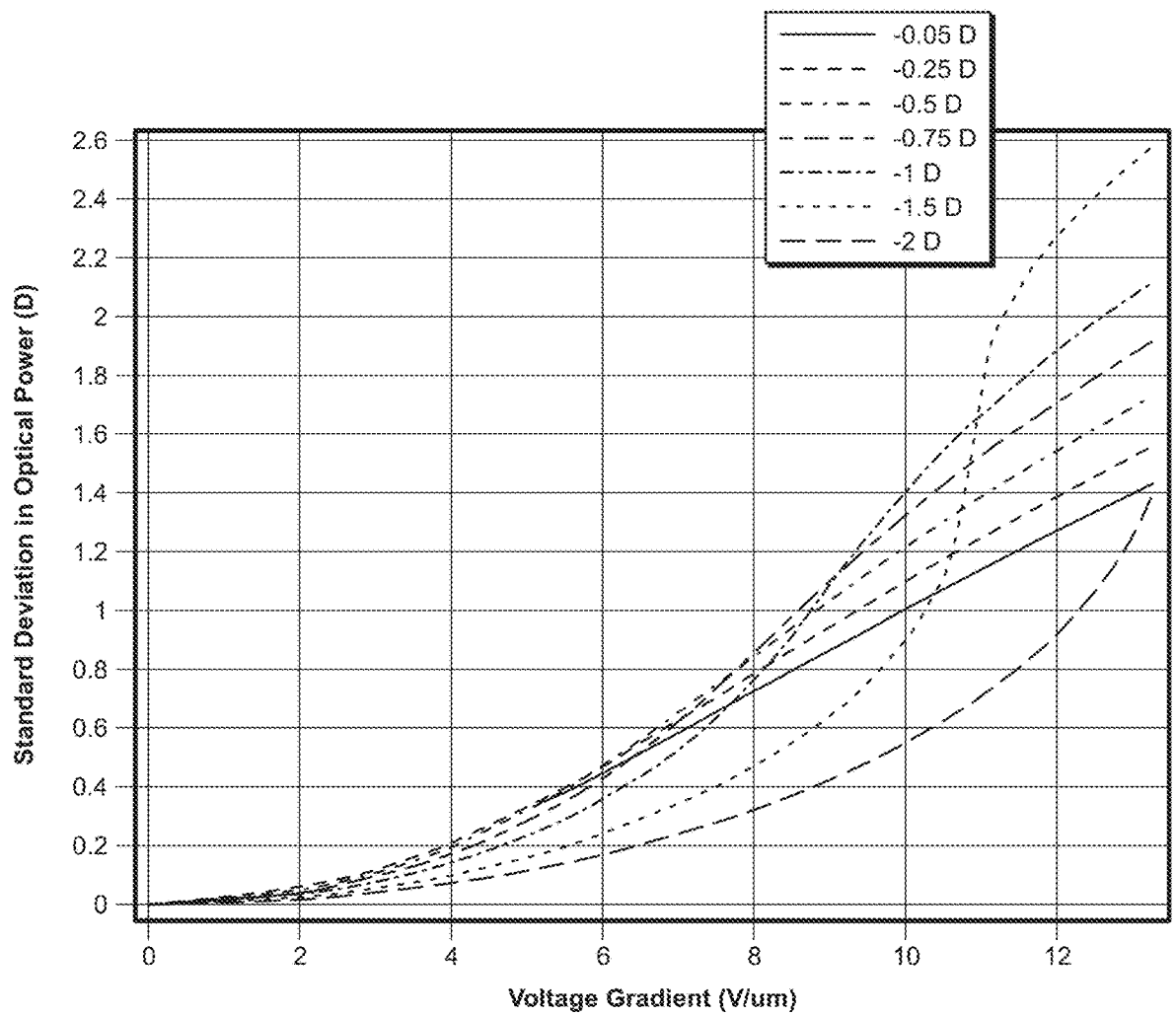
FIG. 10 shows the effect of initial lens curvature in a plot of the standard deviation in optical power as a function of voltage gradient for integrated electromechanical actuators according to some embodiments.

FIG. 10 is a plot of the standard deviation in optical power versus applied voltage for the lens configurations of FIGS. 8 and 9. Demonstrated is a controllable deformation response for initial (unbiased) lens curvatures ranging from −0.25 diopter to −1 diopter.

Figure 11:
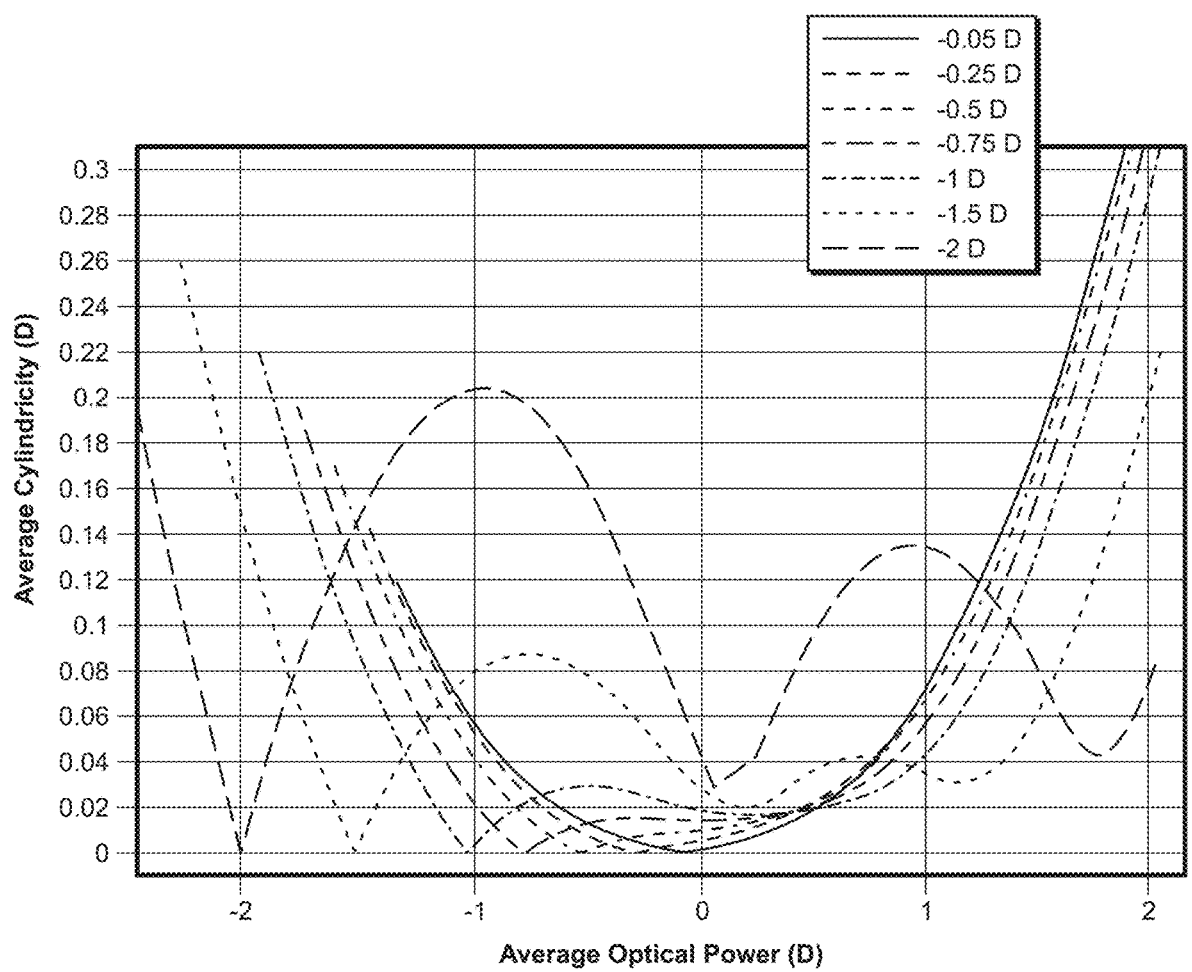
FIG. 11 is a plot of cylindricity versus optical power for example integrated electromechanical actuators showing the effect of initial lens curvature according to further embodiments.
Figure 12:
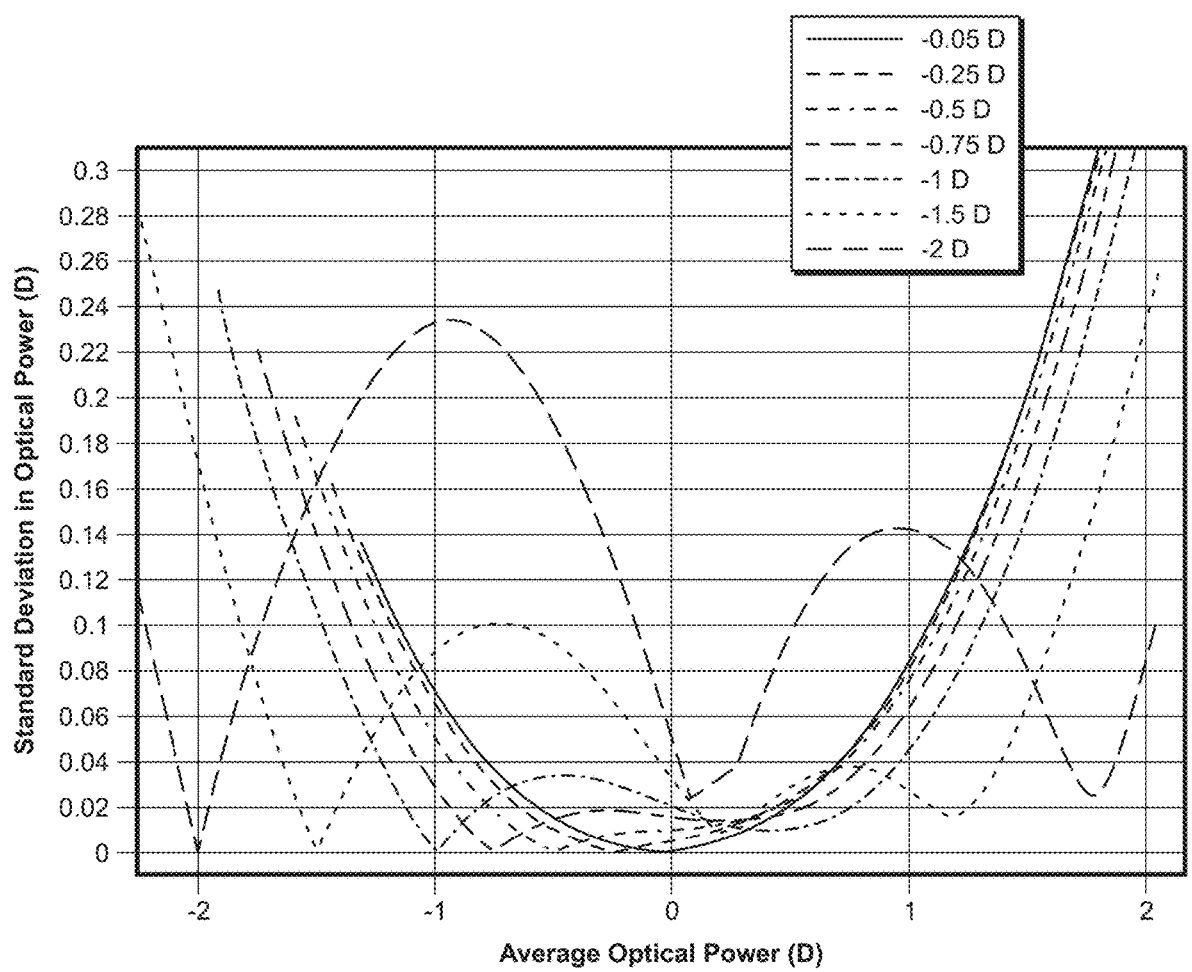
FIG. 12 is a plot of the standard deviation in optical power versus optical power for integrated electromechanical actuators showing the effect of initial lens curvature according to further embodiments.

FIG. 11 is a plot of the average cylindricity in diopters as a function of lens actuation for lenses with different initial curvature, but using a stiffer EAP material than used to generate the plots shown in FIGS. 8-10. The improved optical properties may be associated with an electromechanical actuator having a 0.2 mm thick electroactive polymer layer overlying a 0.18 mm passive polymer layer. For the data plotted in FIG. 11, the electroactive polymer layer is characterized by a $Q_{12}$ response of approximately 5.0 m$^4$/C$^2$, and a Young's modulus of approximately 750 MPa. The passive polymer layer is characterized by a Young's modulus of approximately 6.4 GPa. A corresponding plot of standard deviation in optical power versus optical power for the same lenses is shown in FIG. 12.

Figure 13:
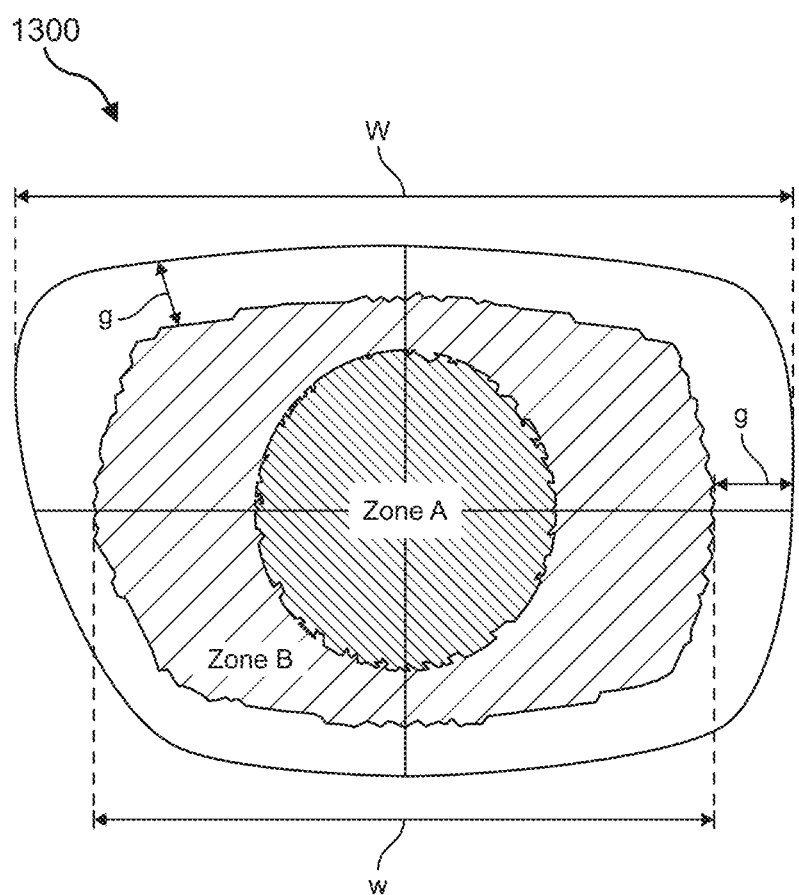
FIG. 13 illustrates the location of Zone A and Zone B regions of an exemplary liquid lens according to various embodiments.

In conjunction with various embodiments, a schematic description of a prototypical lens is shown in FIG. 13. Lens 1300 has an overall width (W) and includes a zone A and a zone B. Zone A corresponds to a substantially circular central region of the lens, and zone B corresponds to a broader region inclusive of zone A having a width (w). The outer periphery of the lens may be spaced away from an outer periphery of zone B by a variable gap (g). In an example lens, the overall width (W) of the lens may be approximately 48 mm, a width (w) of zone B may be approximately 38 mm, zone A may have a radius of approximately 9.3 mm, and the variable gap (g) may be at least approximately 3 mm.

Figure 14:
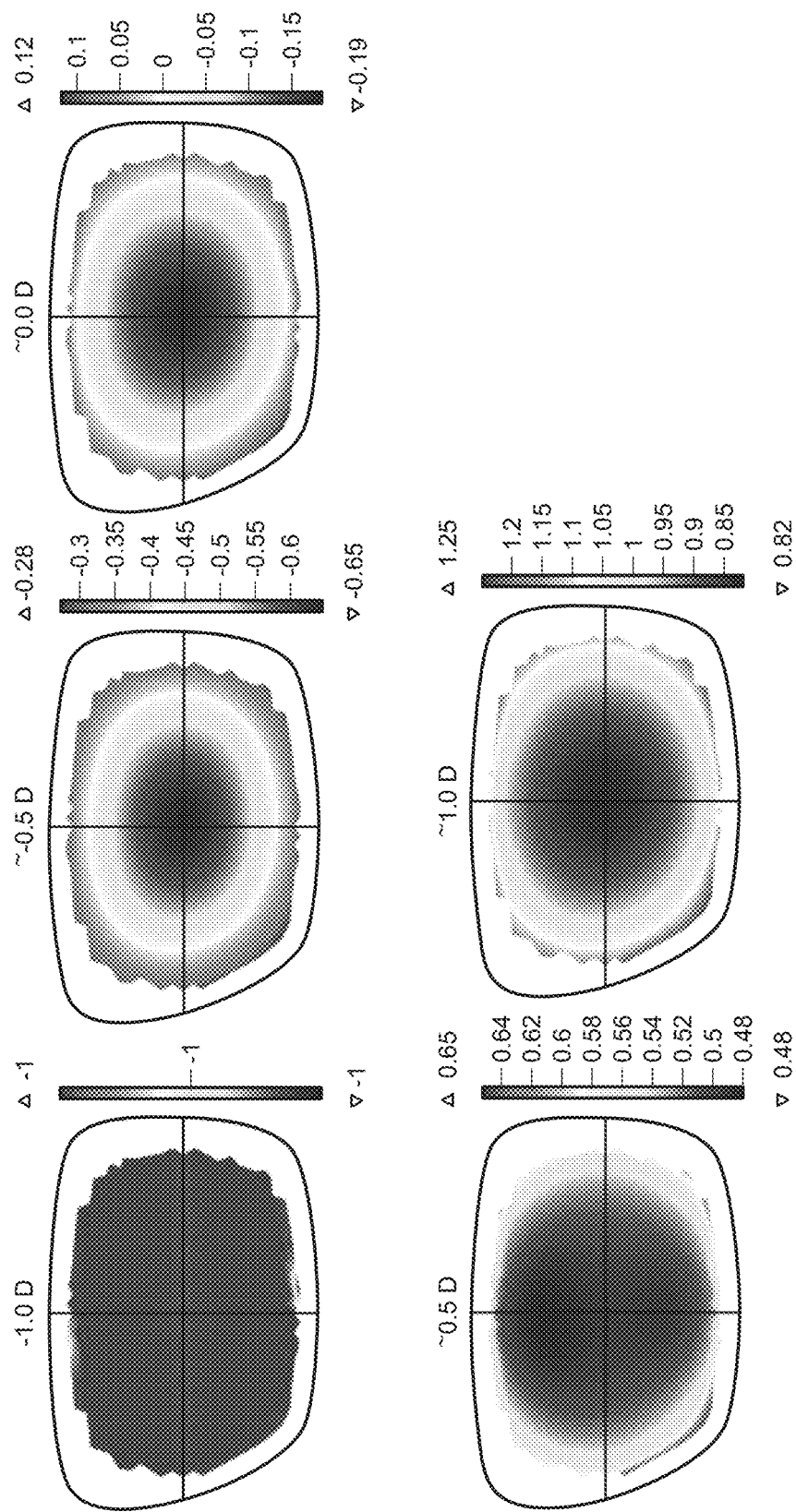
FIG. 14 displays a series of contour plots showing the change in optical power for an example liquid lens integrated with an electromechanical actuator according to some embodiments.
Figure 15:
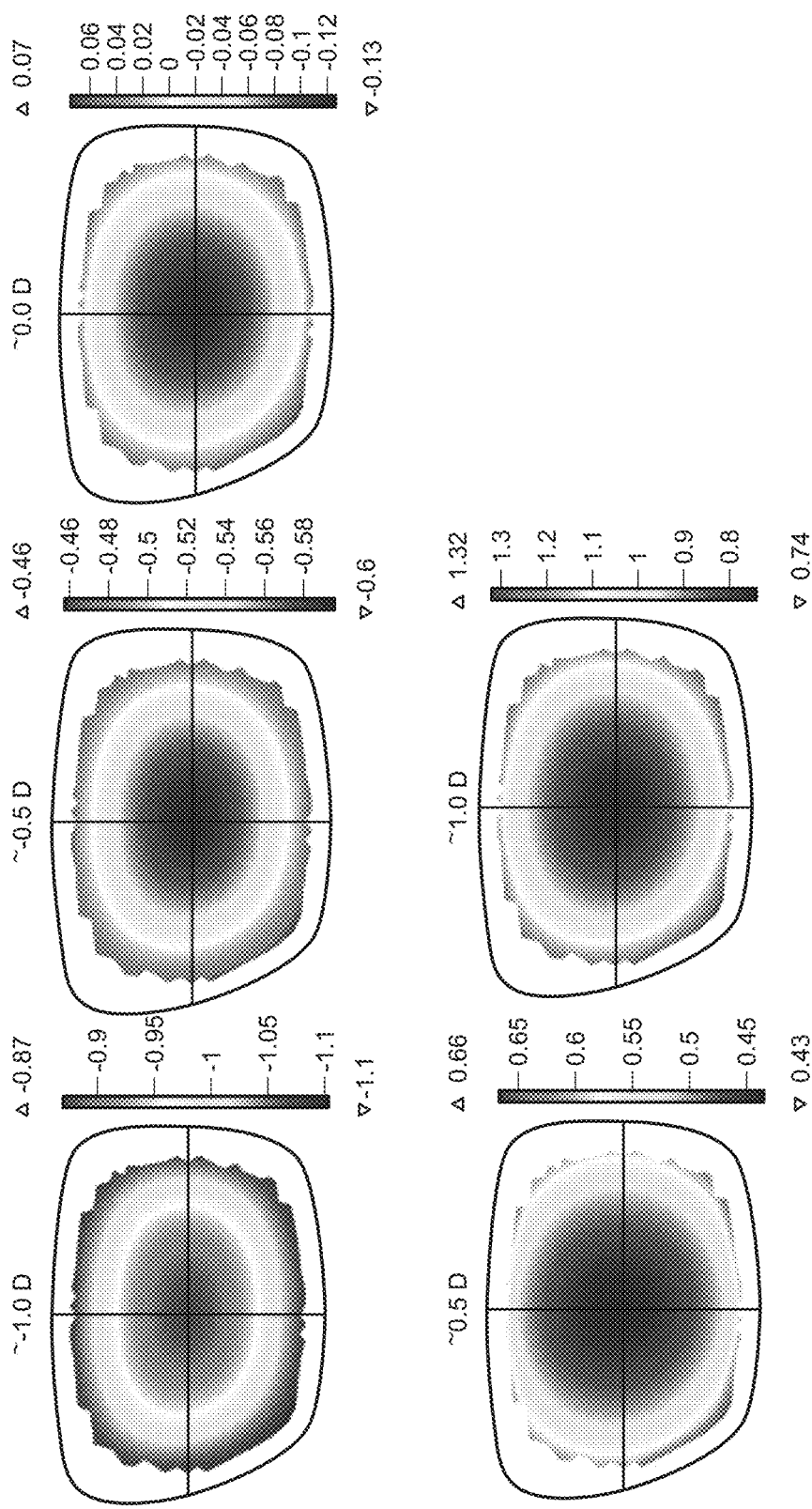
FIG. 15 displays a series of contour plots showing the change in optical power for an example liquid lens integrated with an electromechanical actuator according to further embodiments.

FIG. 14 shows the change in optical power over zone B of a liquid lens having an unbiased (unactuated) curvature of −1.0 diopters. The lens of FIG. 14 shows a uniform evolution in optical power over a range of −1.0 diopter to +1.0 diopter. FIG. 15 shows the change in optical power over zone B of a liquid lens having an unbiased (unactuated) curvature of −0.75 diopters. As with the lens of FIG. 14, the actuation of the lens of FIG. 15 exhibits a uniform optical power over a range of −1.0 diopter to +1.0 diopter.

Figure 16:
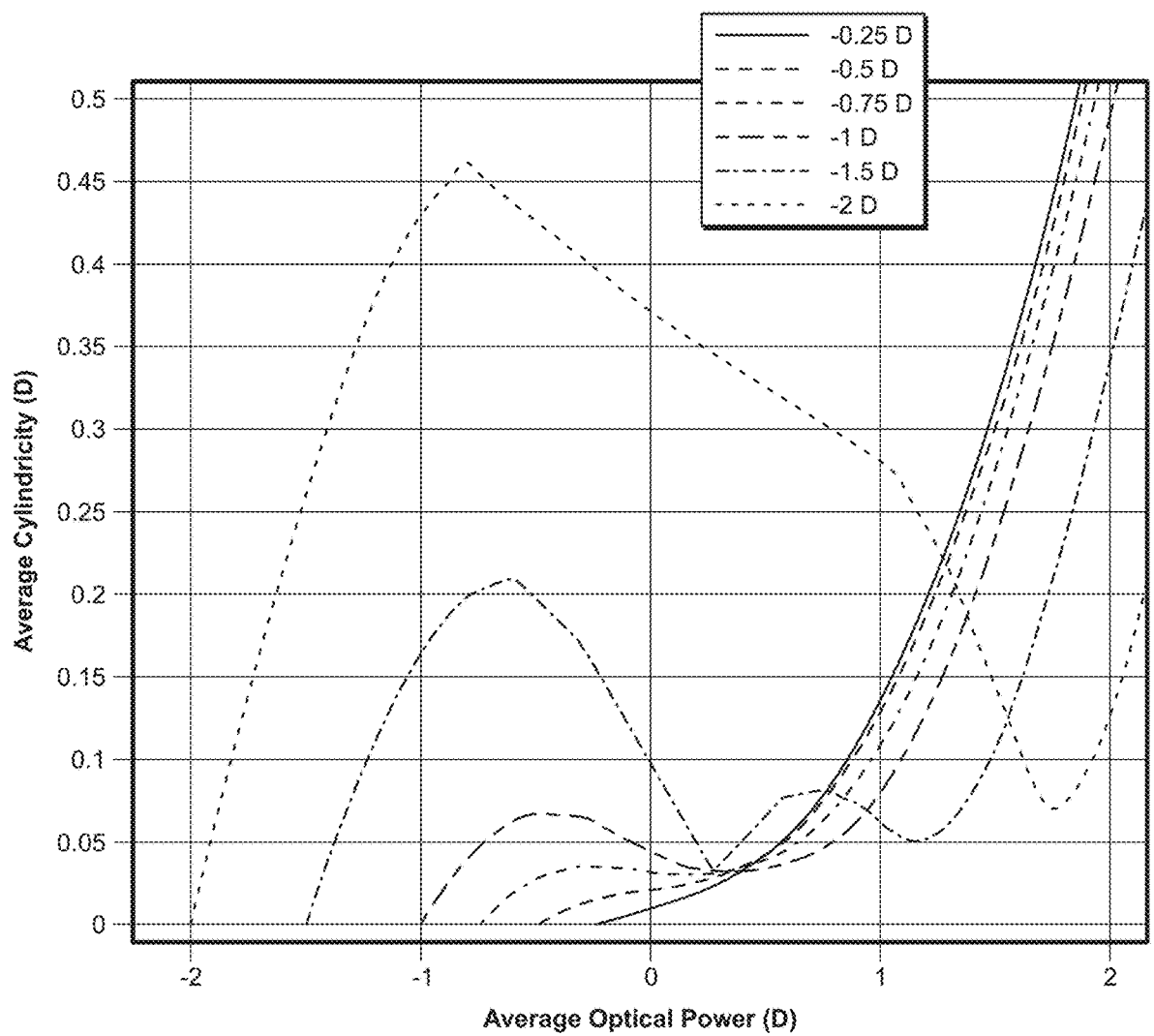
FIG. 16 is a plot of cylindricity versus optical power for an example integrated electromechanical actuator showing the effect of initial lens curvature according to further embodiments.

FIG. 16 shows the change in average cylindricity in diopters as a function of driven optical power for lenses having a different initial (unbiased) curvature. The lenses each include an electromagnetic actuator having a 0.1 mm thick electroactive polymer layer overlying a 0.1 mm thick passive polymer layer. The electroactive polymer layer is disposed between paired electrodes and is characterized by a $Q_{12}$ response of approximately 5.0 m$^4$/C$^2$, a dielectric constant of approximately 400, and a Young's modulus of approximately 750 MPa. The passive polymer layer is characterized by a Young's modulus of approximately 6.4 GPa. The foregoing structure is bonded to a transparent substrate using a peripheral seal having a spring constant of approximately 1×10$^4$ N/m/m.

Figure 17:
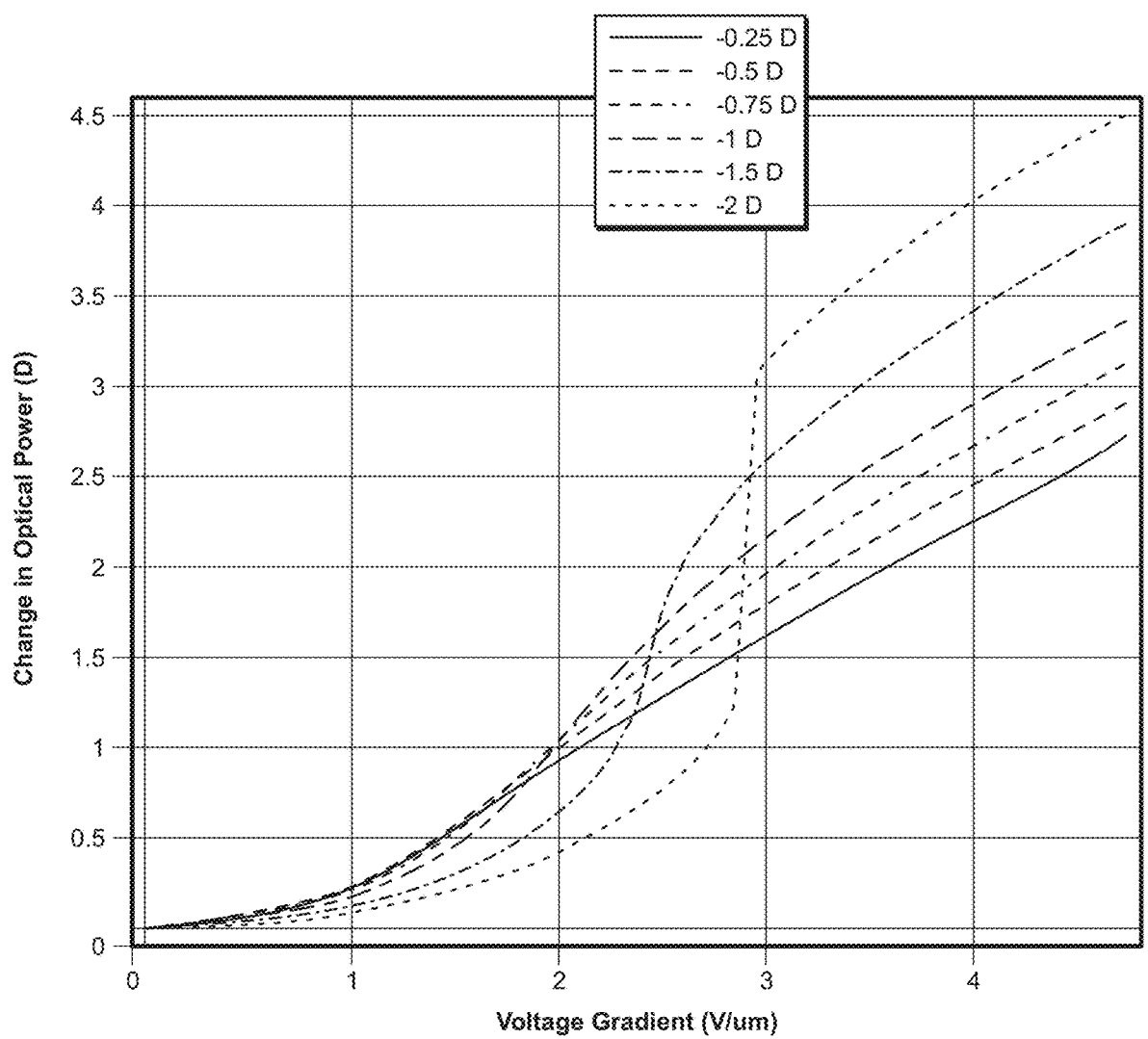
FIG. 17 shows the effect of initial lens curvature in a plot of the change in optical power as a function of voltage gradient for an integrated electromechanical actuator according to further embodiments.

FIG. 17 is a plot of optical power versus applied voltage for the lens configurations of FIG. 16. Demonstrated is a controllable deformation response for initial (unbiased) lens curvatures ranging from −0.25 diopter to −1.5 diopter.

Figure 18:
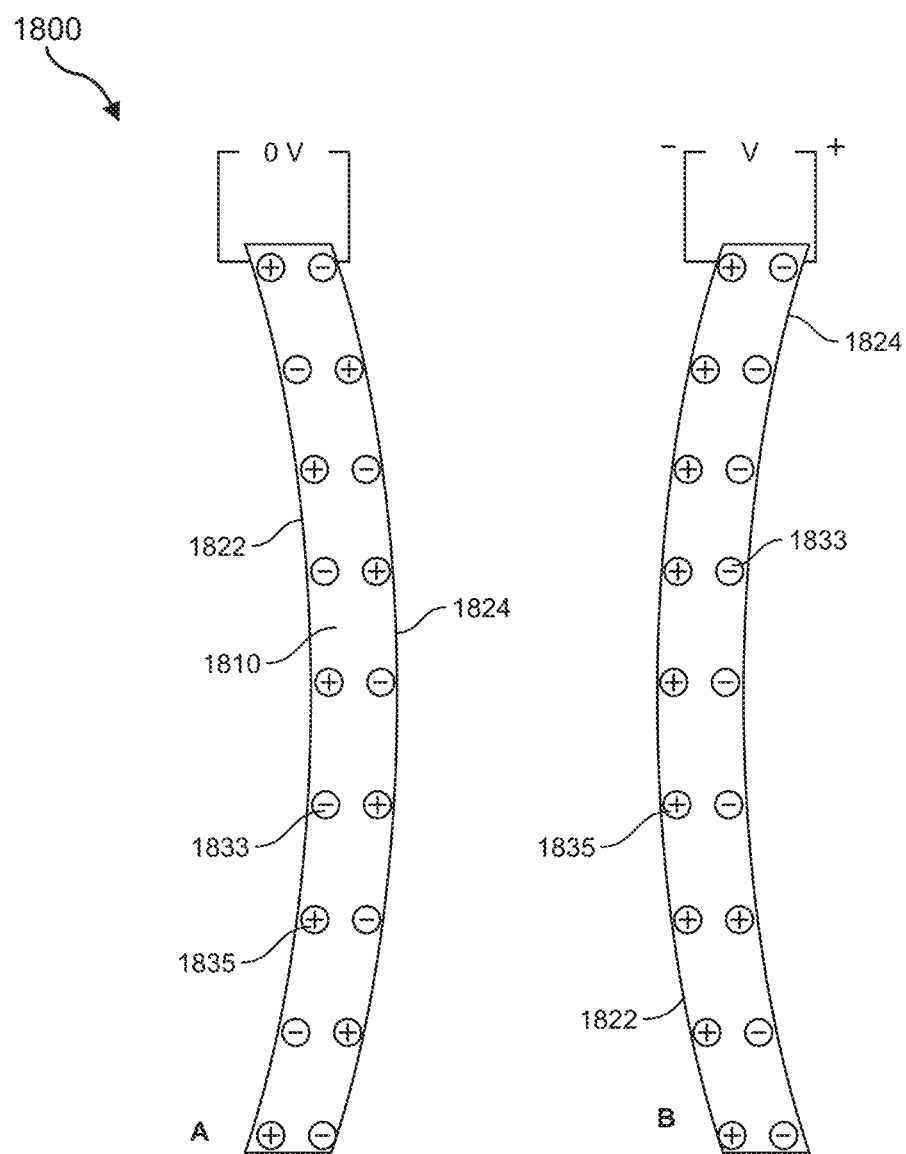
FIG. 18 is a schematic illustration showing the actuation kinetics of an ionic material-based electromechanical actuator according to some embodiments.

A further example electromechanical actuator is shown schematically in FIG. 18. Electromechanical actuator 1800 includes an electroactive layer 1810 disposed between a primary electrode 1822 and a secondary electrode 1824, which may be used to create a switchable lens. In the illustrated embodiment, electroactive layer 1810 may include an ionic polymer, gel, or liquid crystal material, for example. Referring to FIG. 18A, in an unbiased (unactuated) state, electromechanical actuator 1800 may include a random distribution of negative ions 1833 and positive ions 1835, and may exhibit spherical curvature where the electromechanical actuator is concave proximate to the primary electrode 1822 and convex proximate to the secondary electrode 1824.

Referring to FIG. 18B, a voltage may be applied across active layer 1810. In response, positive ions 1835 are attracted to the negatively charged primary electrode 1822 and negative ions 1833 are attracted to the positively charged secondary electrode 1824, which induces a change in curvature.

Aspects of the present disclosure relate to the incorporation of a transparent electromechanical actuator into a deformable optical element such as a liquid lens. Relative to comparative approaches, the actuator may be configured to induce an increased range of spherical deformation in the optical element without creating significant cylindrical deformation.

In various embodiments, the electromechanical actuator may produce a first spherical shape in the absence of an applied electric field and a complementary second spherical shape when a suitable electric field is applied. That is, the first and second spherical shapes may be respectively convex and concave (or vice versa) and may have a substantially equal but opposite radius of curvature. Such an electromechanical actuator may exhibit only a minor degree of cylindricity in both the unbiased and biased states and accordingly possess an increased range of stability.

Advantageously, the generation of a full working range of optical power may be achieved by applying an asymmetric electric field (i.e., only a positive voltage or a negative voltage). Such an approach may be particularly favorable in piezoelectric ceramic-based actuators where the application of an electric field of only one sign may decrease the propensity for de-poling of the piezoelectric layer.

Example actuators may include a unimorph construction having a passive layer and a juxtaposed active layer. For each layer, one or more of composition, thickness, modulus, crystalline content, crystalline orientation, etc. may be selected to control the performance of the actuator. By way of example, the active layer may include a biaxially-oriented, electro-responsive material such as a piezoelectric or electrostrictive polymer, shape memory polymer, ionically conductive polymer, or a piezoelectric ceramic such as PMN-PT.

EXAMPLE EMBODIMENTS

Example 1: An electromechanical actuator includes a primary electrode, a secondary electrode overlying at least a portion of the primary electrode, and an electroactive layer disposed between the primary electrode and the secondary electrode, where the electroactive layer has a first curvature when zero voltage is applied between the primary electrode and the secondary electrode, and a second curvature when a non-zero voltage is applied between the primary electrode and the secondary electrode.

Example 2: The electromechanical actuator of Example 1, where the electroactive layer includes a dielectric elastomer, a piezoelectric polymer, or an electrostrictive polymer.

Example 3: The electromechanical actuator of any of Examples 1 and 2, where the electroactive layer includes a PVDF homopolymer, a P(VDF-TrFE) co-polymer, a P(VDF-TrFE-CFE) ter-polymer, or a P(VDF-TrFE-CTFE) ter-polymer.

Example 4: The electromechanical actuator of Example 1, where the electroactive layer includes at least one of a piezoelectric ceramic, an electrostrictive ceramic, a polycrystalline ceramic, or a single crystal ceramic.

Example 5: The electromechanical actuator of Example 1, where the electroactive layer includes a perovskite ceramic.

Example 6: The electromechanical actuator of Example 1, where the electroactive layer includes an ionically conductive material.

Example 7: The electromechanical actuator of Example 1, where the electroactive layer includes a thermally responsive shape memory polymer.

Example 8: The electromechanical actuator of any of Examples 1-7, where the first curvature and the second curvature each have a spherical profile.

Example 9: The electromechanical actuator of any of Examples 1-8, where the first curvature and the second curvature each have a spherical profile with a radius of curvature of less than approximately 1500 mm.

Example 10: The electromechanical actuator of any of Examples 1-9, where the first curvature has a first radius of curvature (r1), the second curvature has a second radius of curvature (r2), and r1 is substantially equal to −r2.

Example 11: The electromechanical actuator of any of Examples 1-10, where the first curvature and the second curvature are each substantially free of cylindrical curvature.

Example 12: The electromechanical actuator of any of Examples 1-11, further including a deformable passive layer located between the electroactive layer and the primary electrode, where the deformable passive layer includes a material selected from a gel, a foam, a liquid, a gas, and a polymer.

Example 13: The electromechanical actuator of any of Examples 1-12, where the electromechanical actuator is optically transparent.

Example 14: The electromechanical actuator of any of Examples 1-13, where a surface of the electromechanical actuator has a specular reflectivity of at least approximately 80%.

Example 15: A liquid lens including the electromechanical actuator of any of Examples 1-14.

Example 16: A liquid lens includes a substrate, an electroactive layer overlying the substrate, a liquid layer disposed between the substrate and the electroactive layer, and a seal located between the substrate and the electroactive layer peripheral to the liquid layer, where the electroactive layer has a first curvature (r1) when zero voltage is applied across the electroactive layer, a second curvature (r2) when a non-zero voltage is applied across the electroactive layer, and r1 is substantially equal to −r2.

Example 17: The liquid lens of Example 16, further including a deformable passive layer overlying a major surface of the electroactive layer.

Example 18: The liquid lens of any of Examples 16 and 17, where an optical error indicator for the liquid lens over an optical power range of −1 diopter to +1 diopter is less than approximately 0.15.

Example 19: A method includes forming an actuator having an electroactive layer disposed between a primary electrode and a secondary electrode over a transparent substrate, the electroactive layer having a first radius of curvature (r1) when zero voltage is applied between the primary electrode and the secondary electrode, and applying a non-zero voltage to at least one of the electrodes to induce a second radius of curvature (r2) in the electroactive layer, wherein r1 is substantially equal to −r2.

Example 20: The method of Example 19, where applying the voltage creates a spherical profile in a surface of the electroactive layer.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 1900 in FIG. 19) or that visually immerses a user in an artificial reality (such as, e.g., virtual-reality system 2000 in FIG. 20). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 19:
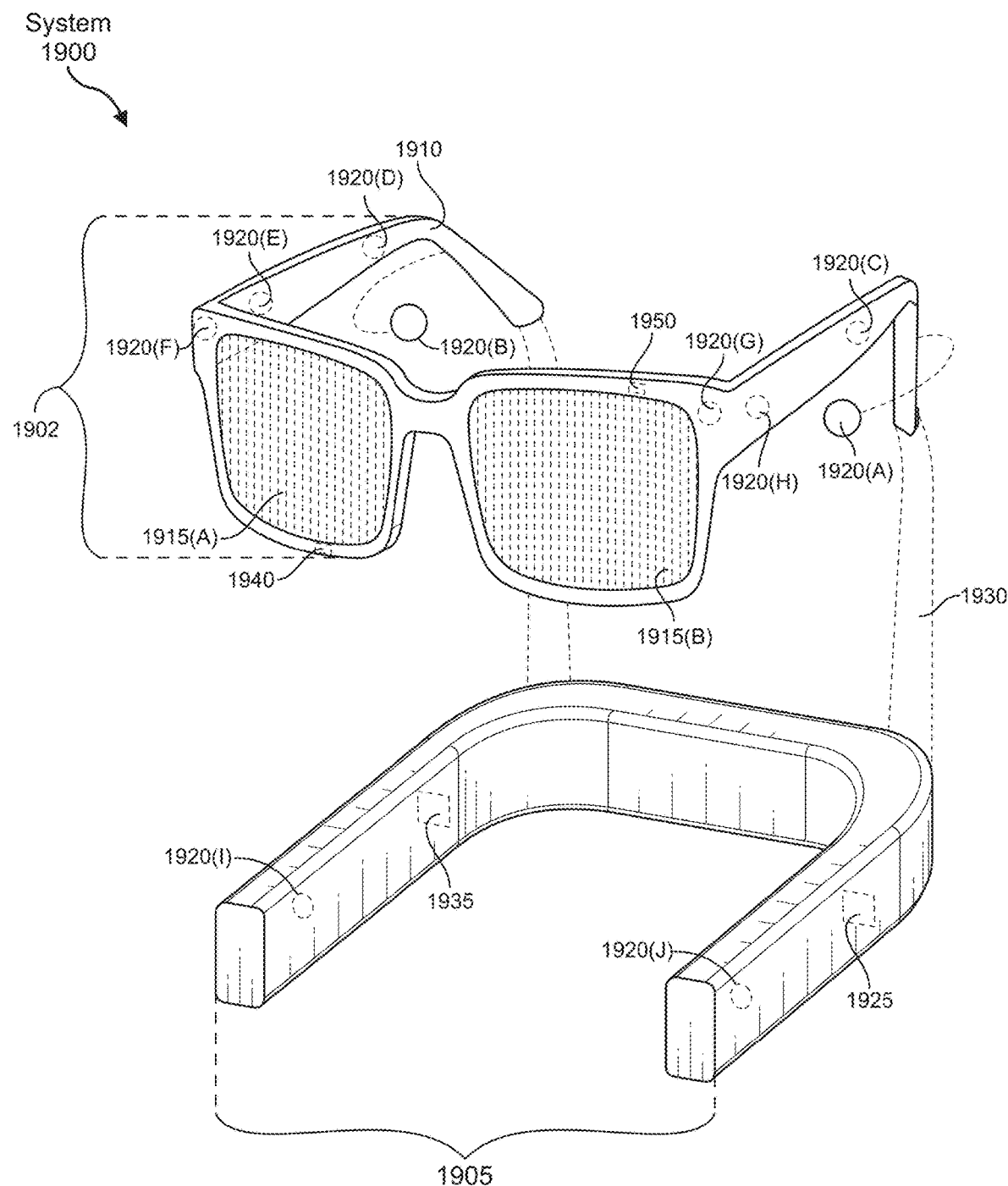
FIG. 19 is an illustration of exemplary augmented-reality glasses that may be used in connection with embodiments of this disclosure.
Figure 20:
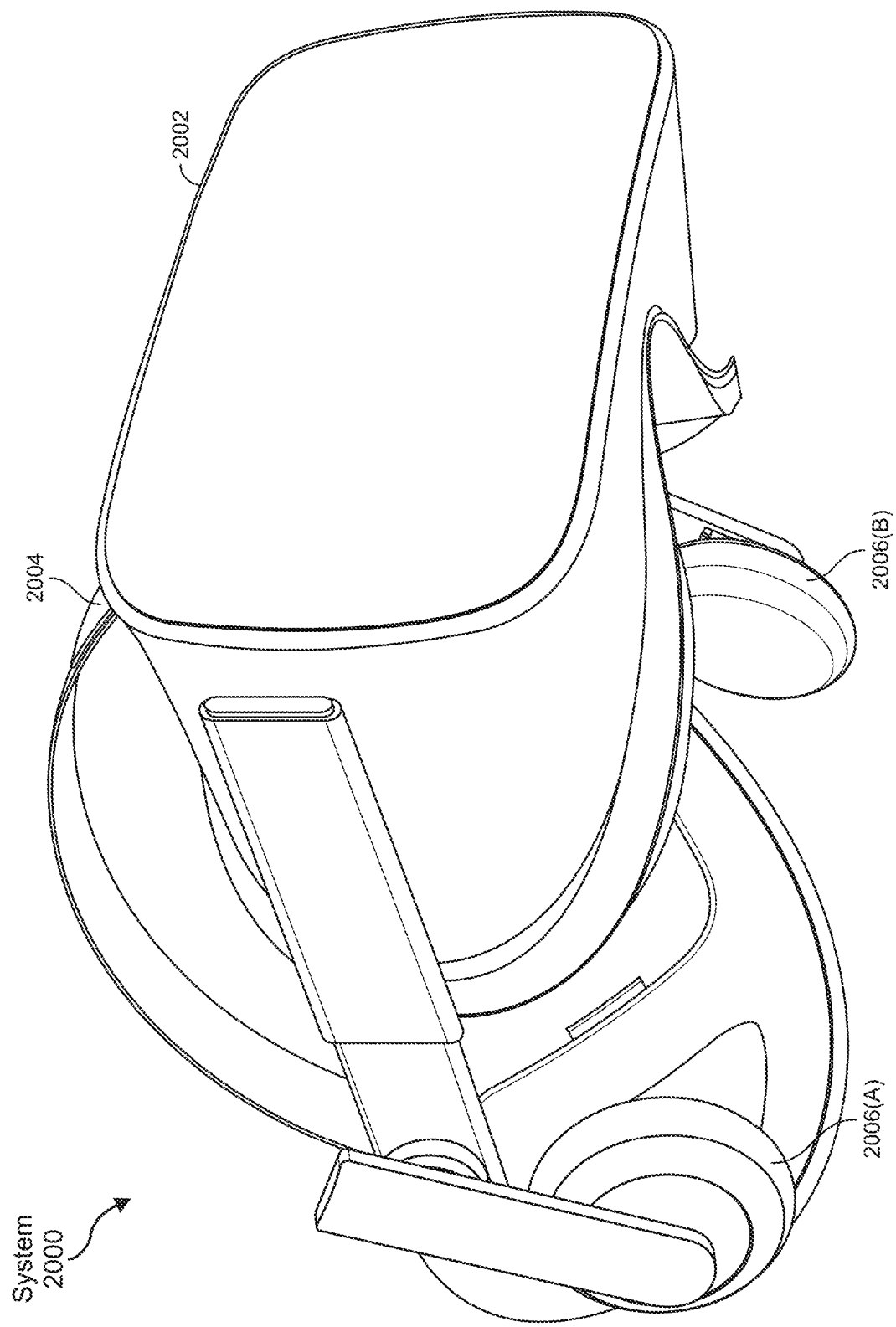
FIG. 20 is an illustration of an exemplary virtual-reality headset that may be used in connection with embodiments of this disclosure.

Turning to FIG. 19, augmented-reality system 1900 may include an eyewear device 1902 with a frame 1910 configured to hold a left display device 1915(A) and a right display device 1915(B) in front of a user's eyes. Display devices 1915(A) and 1915(B) may act together or independently to present an image or series of images to a user. While augmented-reality system 1900 includes two displays, embodiments of this disclosure may be implemented in augmented-reality systems with a single NED or more than two NEDs.

In some embodiments, augmented-reality system 1900 may include one or more sensors, such as sensor 1940. Sensor 1940 may generate measurement signals in response to motion of augmented-reality system 1900 and may be located on substantially any portion of frame 1910. Sensor 1940 may represent one or more of a variety of different sensing mechanisms, such as a position sensor, an inertial measurement unit (IMU), a depth camera assembly, a structured light emitter and/or detector, or any combination thereof. In some embodiments, augmented-reality system 1900 may or may not include sensor 1940 or may include more than one sensor. In embodiments in which sensor 1940 includes an IMU, the IMU may generate calibration data based on measurement signals from sensor 1940. Examples of sensor 1940 may include, without limitation, accelerometers, gyroscopes, magnetometers, other suitable types of sensors that detect motion, sensors used for error correction of the IMU, or some combination thereof.

In some examples, augmented-reality system 1900 may also include a microphone array with a plurality of acoustic transducers 1920(A)-1920(J), referred to collectively as acoustic transducers 1920. Acoustic transducers 1920 may represent transducers that detect air pressure variations induced by sound waves. Each acoustic transducer 1920 may be configured to detect sound and convert the detected sound into an electronic format (e.g., an analog or digital format). The microphone array in FIG. 19 may include, for example, ten acoustic transducers: 1920(A) and 1920(B), which may be designed to be placed inside a corresponding ear of the user, acoustic transducers 1920(C), 1920(D), 1920(E), 1920(F), 1920(G), and 1920(H), which may be positioned at various locations on frame 1910, and/or acoustic transducers 1920(I) and 1920(J), which may be positioned on a corresponding neckband 1905.

In some embodiments, one or more of acoustic transducers 1920(A)-(J) may be used as output transducers (e.g., speakers). For example, acoustic transducers 1920(A) and/or 1920(B) may be earbuds or any other suitable type of headphone or speaker.

The configuration of acoustic transducers 1920 of the microphone array may vary. While augmented-reality system 1900 is shown in FIG. 19 as having ten acoustic transducers 1920, the number of acoustic transducers 1920 may be greater or less than ten. In some embodiments, using higher numbers of acoustic transducers 1920 may increase the amount of audio information collected and/or the sensitivity and accuracy of the audio information. In contrast, using a lower number of acoustic transducers 1920 may decrease the computing power required by an associated controller 1950 to process the collected audio information. In addition, the position of each acoustic transducer 1920 of the microphone array may vary. For example, the position of an acoustic transducer 1920 may include a defined position on the user, a defined coordinate on frame 1910, an orientation associated with each acoustic transducer 1920, or some combination thereof.

Acoustic transducers 1920(A) and 1920(B) may be positioned on different parts of the user's ear, such as behind the pinna, behind the tragus, and/or within the auricle or fossa. Or, there may be additional acoustic transducers 1920 on or surrounding the ear in addition to acoustic transducers 1920 inside the ear canal. Having an acoustic transducer 1920 positioned next to an ear canal of a user may enable the microphone array to collect information on how sounds arrive at the ear canal. By positioning at least two of acoustic transducers 1920 on either side of a user's head (e.g., as binaural microphones), augmented-reality device 1900 may simulate binaural hearing and capture a 3D stereo sound field around about a user's head. In some embodiments, acoustic transducers 1920(A) and 1920(B) may be connected to augmented-reality system 1900 via a wired connection 1930, and in other embodiments acoustic transducers 1920(A) and 1920(B) may be connected to augmented-reality system 1900 via a wireless connection (e.g., a BLUETOOTH connection). In still other embodiments, acoustic transducers 1920(A) and 1920(B) may not be used at all in conjunction with augmented-reality system 1900.

Acoustic transducers 1920 on frame 1910 may be positioned in a variety of different ways, including along the length of the temples, across the bridge, above or below display devices 1915(A) and 1915(B), or some combination thereof. Acoustic transducers 1920 may also be oriented such that the microphone array is able to detect sounds in a wide range of directions surrounding the user wearing the augmented-reality system 1900. In some embodiments, an optimization process may be performed during manufacturing of augmented-reality system 1900 to determine relative positioning of each acoustic transducer 1920 in the microphone array.

In some examples, augmented-reality system 1900 may include or be connected to an external device (e.g., a paired device), such as neckband 1905. Neckband 1905 generally represents any type or form of paired device. Thus, the following discussion of neckband 1905 may also apply to various other paired devices, such as charging cases, smart watches, smart phones, wrist bands, other wearable devices, hand-held controllers, tablet computers, laptop computers, other external compute devices, etc.

As shown, neckband 1905 may be coupled to eyewear device 1902 via one or more connectors. The connectors may be wired or wireless and may include electrical and/or non-electrical (e.g., structural) components. In some cases, eyewear device 1902 and neckband 1905 may operate independently without any wired or wireless connection between them. While FIG. 19 illustrates the components of eyewear device 1902 and neckband 1905 in example locations on eyewear device 1902 and neckband 1905, the components may be located elsewhere and/or distributed differently on eyewear device 1902 and/or neckband 1905. In some embodiments, the components of eyewear device 1902 and neckband 1905 may be located on one or more additional peripheral devices paired with eyewear device 1902, neckband 1905, or some combination thereof.

Pairing external devices, such as neckband 1905, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1900 may be provided by a paired device or shared between a paired device and an eyewear device, thus reducing the weight, heat profile, and form factor of the eyewear device overall while still retaining desired functionality. For example, neckband 1905 may allow components that would otherwise be included on an eyewear device to be included in neckband 1905 since users may tolerate a heavier weight load on their shoulders than they would tolerate on their heads. Neckband 1905 may also have a larger surface area over which to diffuse and disperse heat to the ambient environment. Thus, neckband 1905 may allow for greater battery and computation capacity than might otherwise have been possible on a stand-alone eyewear device. Since weight carried in neckband 1905 may be less invasive to a user than weight carried in eyewear device 1902, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1905 may be communicatively coupled with eyewear device 1902 and/or to other devices. These other devices may provide certain functions (e.g., tracking, localizing, depth mapping, processing, storage, etc.) to augmented-reality system 1900. In the embodiment of FIG. 19, neckband 1905 may include two acoustic transducers (e.g., 1920(I) and 1920(J)) that are part of the microphone array (or potentially form their own microphone subarray). Neckband 1905 may also include a controller 1925 and a power source 1935.

Acoustic transducers 1920(I) and 1920(J) of neckband 1905 may be configured to detect sound and convert the detected sound into an electronic format (analog or digital). In the embodiment of FIG. 19, acoustic transducers 1920(I) and 1920(J) may be positioned on neckband 1905, thereby increasing the distance between the neckband acoustic transducers 1920(I) and 1920(J) and other acoustic transducers 1920 positioned on eyewear device 1902. In some cases, increasing the distance between acoustic transducers 1920 of the microphone array may improve the accuracy of beamforming performed via the microphone array. For example, if a sound is detected by acoustic transducers 1920(C) and 1920(D) and the distance between acoustic transducers 1920(C) and 1920(D) is greater than, e.g., the distance between acoustic transducers 1920(D) and 1920(E), the determined source location of the detected sound may be more accurate than if the sound had been detected by acoustic transducers 1920(D) and 1920(E).

Controller 1925 of neckband 1905 may process information generated by the sensors on neckband 1905 and/or augmented-reality system 1900. For example, controller 1925 may process information from the microphone array that describes sounds detected by the microphone array. For each detected sound, controller 1925 may perform a direction-of-arrival (DOA) estimation to estimate a direction from which the detected sound arrived at the microphone array. As the microphone array detects sounds, controller 1925 may populate an audio data set with the information. In embodiments in which augmented-reality system 1900 includes an inertial measurement unit, controller 1925 may compute all inertial and spatial calculations from the IMU located on eyewear device 1902. A connector may convey information between augmented-reality system 1900 and neckband 1905 and between augmented-reality system 1900 and controller 1925. The information may be in the form of optical data, electrical data, wireless data, or any other transmittable data form. Moving the processing of information generated by augmented-reality system 1900 to neckband 1905 may reduce weight and heat in eyewear device 1902, making it more comfortable to the user.

Power source 1935 in neckband 1905 may provide power to eyewear device 1902 and/or to neckband 1905. Power source 1935 may include, without limitation, lithium ion batteries, lithium-polymer batteries, primary lithium batteries, alkaline batteries, or any other form of power storage. In some cases, power source 1935 may be a wired power source. Including power source 1935 on neckband 1905 instead of on eyewear device 1902 may help better distribute the weight and heat generated by power source 1935.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 2000 in FIG. 20, that mostly or completely covers a user's field of view. Virtual-reality system 2000 may include a front rigid body 2002 and a band 2004 shaped to fit around a user's head. Virtual-reality system 2000 may also include output audio transducers 2006(A) and 2006(B). Furthermore, while not shown in FIG. 20, front rigid body 2002 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 1900 and/or virtual-reality system 2000 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 1900 and/or virtual-reality system 2000 may include microLED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 1900 and/or virtual-reality system 2000 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an electroactive material that comprises or includes PVDF include embodiments where an electroactive material consists of PVDF and embodiments where an electroactive material consists essentially of PVDF.

What is claimed is:

1. A liquid lens comprising:
    a substrate;
    an electroactive layer overlying the substrate and disposed between a primary electrode and a secondary electrode;
    a liquid layer disposed between the substrate and the electroactive layer, the liquid layer extending along an entire length of each of the substrate and the electroactive layer; and
    a seal located between the substrate and the electroactive layer peripheral to the liquid layer, wherein the electroactive layer has a first curvature (r1) between the electrodes primary electrode and the secondary electrode when zero voltage is applied across the electroactive layer, a second curvature (r2) between the electrodes primary electrode and the secondary electrode when a non-zero voltage is applied across the electroactive layer, and r1 is substantially equal to −r2, wherein the primary electrode and the secondary electrode each comprise a transparent conductive oxide and extend across an optical aperture of the liquid lens.

2. The liquid lens of claim 1, further comprising a deformable passive layer overlying a major surface of the electroactive layer.

3. The liquid lens of claim 1, wherein an optical error indicator for the liquid lens over an optical power range of −1 diopter to +1 diopter is less than approximately 0.15.

* * * * *